(12) United States Patent
Pawlowski

(10) Patent No.: US 11,003,363 B2
(45) Date of Patent: May 11, 2021

(54) SCALABLE MEMORY SYSTEM PROTOCOL SUPPORTING PROGRAMMABLE NUMBER OF LEVELS OF INDIRECTION

(71) Applicant: Micron Technology, Inc., Boise, ID (US)

(72) Inventor: J. Thomas Pawlowski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 128 days.

(21) Appl. No.: 16/208,035

(22) Filed: Dec. 3, 2018

(65) Prior Publication Data

US 2019/0102095 A1    Apr. 4, 2019

Related U.S. Application Data

(60) Continuation of application No. 15/666,410, filed on Aug. 1, 2017, now Pat. No. 10,540,104, which is a
(Continued)

(51) Int. Cl.
*G06F 11/00* (2006.01)
*G06F 3/06* (2006.01)
(Continued)

(52) U.S. Cl.
CPC ............ *G06F 3/0619* (2013.01); *G06F 3/061* (2013.01); *G06F 3/0604* (2013.01); *G06F 3/0611* (2013.01); *G06F 3/0617* (2013.01); *G06F 3/0644* (2013.01); *G06F 3/0655* (2013.01); *G06F 3/0656* (2013.01);
(Continued)

(58) Field of Classification Search
CPC ...... G06F 3/0619; G06F 3/0604; G06F 11/07; G06F 11/1016; G06F 11/1044; G06F 11/1072; G06F 3/0644; G11C 29/52; H04L 1/189
See application file for complete search history.

(56) References Cited

U.S. PATENT DOCUMENTS 5,592,623 A    1/1997    Kurobe
7,315,898 B2    1/2008    Kohno
(Continued)

FOREIGN PATENT DOCUMENTS

WO    2012040649 A2    3/2012

OTHER PUBLICATIONS

International Search Report and Written Opinion for PCT Application No. PCT/US2015/033568 dated Aug. 27, 2015.
(Continued)

*Primary Examiner* — Esaw T Abraham
(74) *Attorney, Agent, or Firm* — Fletcher Yoder, P.C.

(57) ABSTRACT

A memory device includes a memory component that stores data and a processor. The processor may receive requests from a requesting component to perform a plurality of data operations, generate a plurality of packets associated with the plurality of data operations, and continuously transmit each of the plurality of packets until each of the plurality of packets are transmitted. Each of the plurality of packets after the first packet of the plurality of packets is transmitted on a subsequent clock cycle immediately after a previous packet is transmitted.

9 Claims, 10 Drawing Sheets

Related U.S. Application Data division of application No. 14/724,473, filed on May 28, 2015, now Pat. No. 9,747,048.

(60) Provisional application No. 62/006,668, filed on Jun. 2, 2014.

(51) Int. Cl.

| | |
|---|---|
| *G06F 13/16* | (2006.01) |
| *G06F 11/10* | (2006.01) |
| *G06F 13/38* | (2006.01) |
| *G06F 11/07* | (2006.01) |
| *G11C 29/52* | (2006.01) |
| *H04L 1/18* | (2006.01) |
| *H04L 12/801* | (2013.01) |
| *H04L 12/825* | (2013.01) |
| *H04L 12/873* | (2013.01) |

(52) U.S. Cl.
CPC .......... *G06F 3/0659* (2013.01); *G06F 3/0673* (2013.01); *G06F 3/0679* (2013.01); *G06F 3/0683* (2013.01); *G06F 3/0685* (2013.01); *G06F 3/0688* (2013.01); *G06F 11/07* (2013.01); *G06F 11/073* (2013.01); *G06F 11/076* (2013.01); *G06F 11/0727* (2013.01); *G06F 11/10* (2013.01); *G06F 11/1016* (2013.01); *G06F 11/1044* (2013.01); *G06F 11/1068* (2013.01); *G06F 11/1072* (2013.01); *G06F 13/16* (2013.01); *G06F 13/38* (2013.01); *G11C 29/52* (2013.01); *H04L 1/189* (2013.01); *H04L 47/12* (2013.01); *H04L 47/25* (2013.01); *H04L 47/52* (2013.01); *Y02D 10/00* (2018.01)

(56) References Cited

U.S. PATENT DOCUMENTS

| | | | |
|---|---|---|---|
| 7,359,345 B2 | 4/2008 | Chang et al. | |
| 7,620,847 B1 | 11/2009 | Maxemchuk et al. | |
| 7,974,243 B2 | 7/2011 | Nagata et al. | |
| 8,305,991 B1 | 11/2012 | Vargantwar et al. | |
| 8,724,636 B2 | 5/2014 | Chen et al. | |
| 8,751,865 B2 | 6/2014 | Maxemchuk et al. | |
| 8,811,218 B2 | 8/2014 | Kim et al. | |
| 9,225,357 B2 | 12/2015 | Myung et al. | |
| 9,971,713 B2 * | 5/2018 | Asaad | G06F 9/3885 |
| 2002/0191603 A1 | 12/2002 | Shin et al. | |
| 2005/0210185 A1 | 9/2005 | Renick | |
| 2009/0327842 A1 * | 12/2009 | Liu | H03M 13/154 |
| | | | 714/776 |
| 2010/0050057 A1 * | 2/2010 | Luby | H04L 1/0041 |
| | | | 714/776 |
| 2012/0042227 A1 * | 2/2012 | Watson | H04N 19/89 |
| | | | 714/776 |
| 2012/0290746 A1 | 11/2012 | Nagao et al. | |
| 2013/0170298 A1 | 7/2013 | Kim et al. | |
| 2013/0195210 A1 | 8/2013 | Swarbrick et al. | |
| 2014/0112339 A1 | 4/2014 | Safranek et al. | |

OTHER PUBLICATIONS

Communication Pursuant to Article 94(3) EPC for EP Application No. 15 802 720.1-1215 dated Apr. 3, 2019.

* cited by examiner

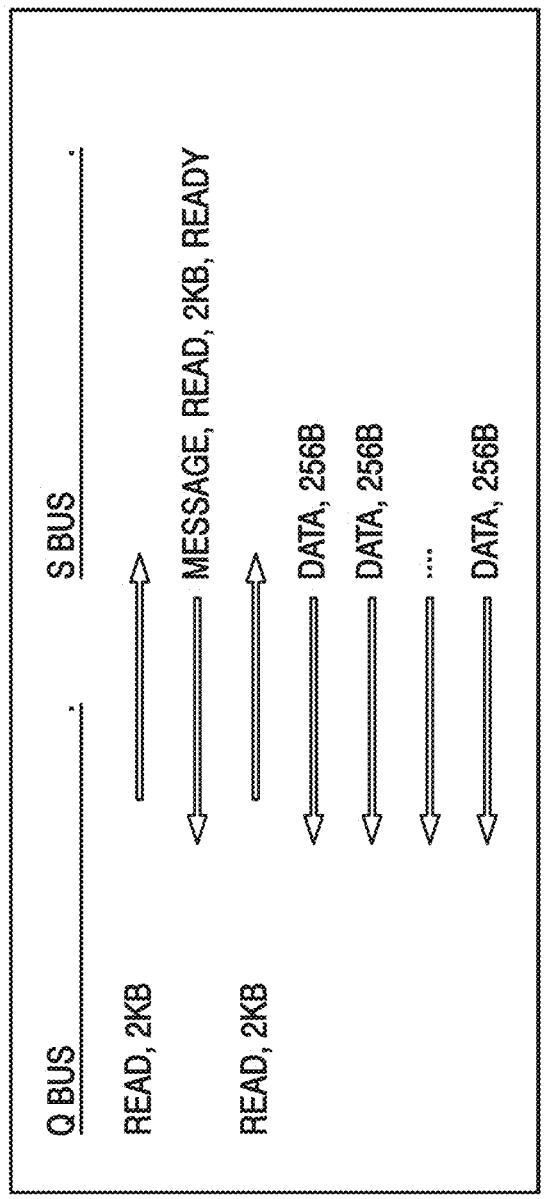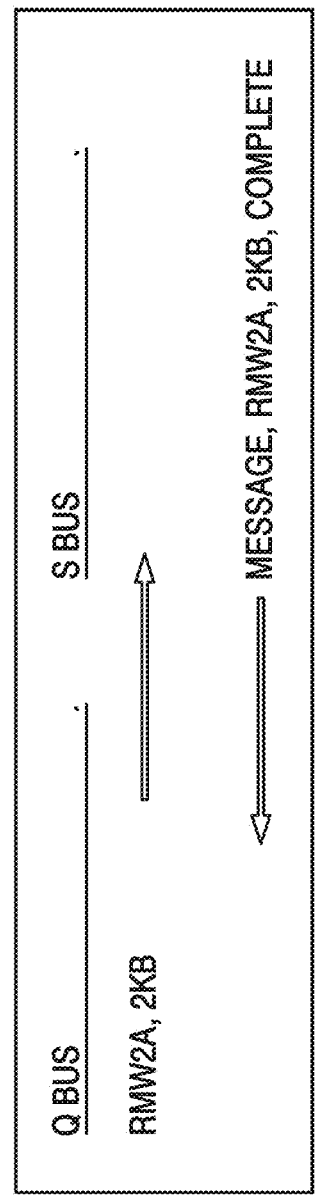
FIG. 6
FIG. 7

FIG. 13
| | Original Order | 1 | 2 | 3 | 4 | 5 | 6 | 7 | 8 | 9 | 10 |
|---|---|---|---|---|---|---|---|---|---|---|---|
| 142 | | | | | | | | | | | |
| 144 | Rename | | | | | 0 | 1 | 2 | 3 | 4 | 5 |
| | Actual Transmission | 1 | 2 | 3 | 4 | | | | | | |
| 146 | Reorder Message | | | | | 1 | 2 | 3 | 0 | 4 | 5 |
| 148 | Actual Original Packet Sent | | | | | 6 | 7 | 8 | 5 | 9 | 10 |
| | Relative Order Sent | | | | | 1 | 2 | 3 | 0 | 4 | 5 |
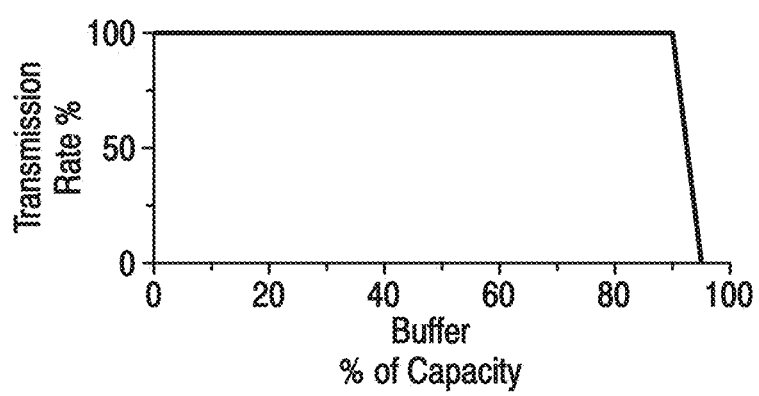
FIG. 16
Linear Throttle - Back
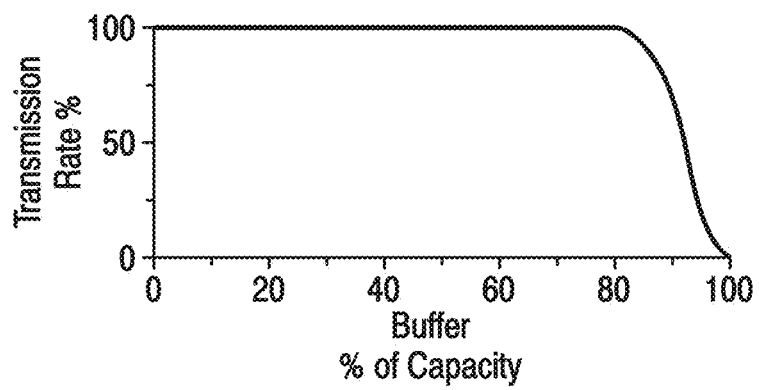
FIG. 17
Non - Linear Throttle - Back

SCALABLE MEMORY SYSTEM PROTOCOL SUPPORTING PROGRAMMABLE NUMBER OF LEVELS OF INDIRECTION

CROSS-REFERENCE TO RELATED APPLICATION

This application is a Continuation of U.S. application Ser. No. 15/666,410, entitled "Systems and Methods for Packing Data In a Scalable Memory System Protocol," and filed on Aug. 1, 2017, now U.S. Pat. No. 10,540,104, issued Jan. 21, 2020, which claims priority to and is a Divisional of U.S. application Ser. No. 14/724,473, entitled "Systems and Methods for Packing Data In a Scalable Memory System Protocol," and filed on May 28, 2015, now U.S. Pat. No. 9,747,048, issued Aug. 29, 2017, which claims priority to U.S. Provisional Patent Application No. 62/006,668, entitled "Systems and Methods for a Scalable Memory System Protocol," filed Jun. 2, 2014, which is herein incorporated by reference herein in its entirety for all purposes. This application is also related to U.S. patent application Ser. No. 14/724,558, entitled "Systems and Methods for Improving Efficiencies of a Memory System," filed May 28, 2015, now U.S. Pat. No. 9,696,920, issued Jul. 4, 2017, which is also herein incorporated by reference herein in its entirety for all purposes.

BACKGROUND

1. Field of the Invention

The present disclosure is generally related to a memory system protocol used for performing data operations (e.g., read, write) using memory devices. More specifically, the present disclosure is related to a packet-based scalable protocol that enables a number of memory and processing combinations, provides bit-efficient data transfer operations, and is concordant with a variety of bus types (e.g., electrical, optical).

2. Description of the Related Art

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Conventional protocols generally transmit packets between memory devices with relatively low failure rates as compared with their predecessors. However, as industries aim to minimize the amount of energy involved in moving packets of data between memory devices and other components, it is desirable to use protocols that efficiently move packets of data using a minimal amount of energy, while maintaining the integrity of the packet transmission.

BRIEF DESCRIPTION OF THE DRAWINGS

Various aspects of this disclosure may better be understood upon reading the following detailed description and upon reference to the drawings in which:

FIG. 6 illustrates an example of a two-stage response for high latency read operations, in accordance with an embodiment;

FIG. 7 illustrates an example of a one-stage response for high latency direct memory access operation, in accordance with an embodiment;

FIG. 13 illustrates a block diagram showing how packets are reordered with reference to the method of FIG. 12, in accordance with an embodiment;

FIG. 16 illustrates a graph that depicts a linear throttle-back curve, in accordance with an embodiment; and FIG. 17 illustrates a graph that depicts a non-linear throttle-back curve, in accordance with an embodiment.

DETAILED DESCRIPTION OF SPECIFIC EMBODIMENTS

Figure 1:
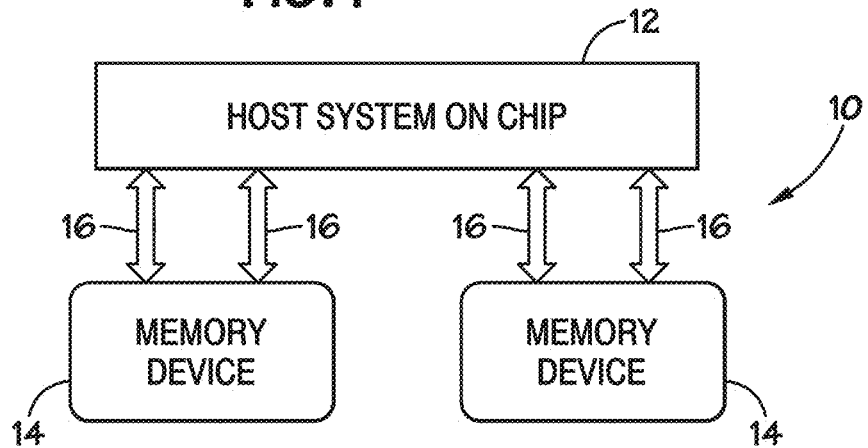
FIG. 1 illustrates a block diagram of an example of a computing system, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Scalable Memory System Protocol

As will be discussed in detail below, the present disclosure generally relates to scalable memory system protocol. That is, the scalable memory system protocol may adjust certain operations based on characteristics of the data packets (e.g., requests, responses) being transferred. In one embodiment, the scalable memory system protocol ("scalable protocol") may be a packet-based protocol that enables an efficient (e.g., power efficient, bit efficient) transmittal of packets of data between memory devices, computing devices, and the like. The scalable protocol may be implemented in a number of combinations with various types of memory and processors such as Automata processors, a Processor-in-Memory, network devices, storage appliances, hierarchical memory, abstracted memory, and the like. As used herein, processors may include any suitable processor capable of performing executable instructions on a corresponding electrical device. The scalable protocol may also facilitate a broad range of devices including data center switches/routers, network routers, mobile devices, storage devices, Automata processors, Stream processors, processor-in-memory, work-moving-processors, Big Data, Big Graph, secure memory, virtual network, general abstracted memory (e.g., Dynamic Random-Access Memory (DRAM), NAND, and emerging memories), and the like.

In certain embodiments, the scalable protocol may be designed to facilitate communication of data packets between various memory and processors while maintaining a lowest reasonable scalable protocol overhead. In other words, the scalable protocol may be designed to provide a bit efficient transfer of data packets in that most, if not all, bits transferred via the scalable protocol are directly part of a corresponding data packet being transmitted. For instance, as will be discussed in more detail below, the scalable protocol may enable request packets to be packed together without padding a signal with zeros unrelated to the respective packets, thereby maximizing a bit efficiency of data packets being transferred via transmission lanes of a bus.

In addition to providing a bit-efficient mechanism to transfer data packets, the scalable protocol may be concordant with a number of bus types, such as electrical or optical buses. Moreover, the scalable protocol may be capable of providing various operations with regard to the respective bus including encoding, lane counting, channel counting, speed, style, instantiation count of a system, and the like.

Scalable Protocol

Keeping the foregoing in mind, the scalable protocol may be optimized to provide for successful transactions such that packet failures are rare (e.g., <1 e-6). The scalable protocol may also provide a careful tradeoff between packet transmission types, sizes, and a number of different packet sizes that may be handled.

As discussed above, industries are more focused on minimizing data movement energy. That is, the energy consumed moving data packets between memory devices should be minimized. As such, the scalable protocol may, within reason, eliminate certain bits and messages that may be discerned from other bits or messages or may otherwise be unnecessary. For example, the scalable protocol may obviate the need for a device to transmit data related to information that may already be known to the receiver.

Moreover, to provide efficient data movement operations, the scalable protocol may facilitate transactions that are "sent to the memory." The scalable protocol may also transfer local operations, where internal data flow is relatively low as compared to external control operations, with the external control operations. Furthermore, the scalable protocol may implement an error control strategy that minimizes overhead using a dynamic field size that adjusts based on the amount of data (e.g., payload) being transmitted in the respective packet.

The scalable protocol may also be designed to use a minimum number of fields to convey data. As such, the scalable protocol may allow field size tuning and flexibility since every packet may not make use of all available fields.

The scalable protocol may also be designed to facilitate the coexistence of low-latency and high-latency data. For example, the scalable protocol may provide the ability to interlace the transmittal of low-latency data between the transmittal high-latency data.

The design of the scalable protocol may be characterized as simple and generic in that the variable packet size may be determined in a single field of the respective packet. Further, the scalable protocol may maintain simplicity in terms of its operations while remaining capable of performing complex transactions and operations. In addition, the scalable protocol may be flexible enough to enable future functions that it may not currently be designed to provide.

In certain embodiments, the scalable protocol may limit the order in which packets are sent using local ordering schemes. That is, the scalable protocol may not enforce certain global synchronization ordering rules or the like. To stay true to the notion that the scalable protocol remains abstract, the scalable protocol may facilitate operations with a special device or with different types of channel properties.

Keeping the foregoing in mind, the present disclosure describes a number of systems and techniques that may be implemented within the scalable protocol to provide for the aforementioned advantages. Although certain systems or techniques detailed below are described independently with respect to other systems or techniques, it should be noted that each of the systems and techniques described herein may be implemented with various other systems and techniques also described herein.

Computing and Memory Systems Using the Scalable Protocol

Turning now to the drawings, FIG. 1 illustrates a block diagram of a computing system 10 that may employ various techniques and systems described herein. The computing system 10 may be any of a variety of computing devices, such as a computer, pager, cellular phone, personal organizer, control circuit, etc. The computing system 10 may include a host system on chip (SoC) 12 that may be coupled to a number of memory devices 14. The host SoC 12 may be an integrated circuit (IC) that integrates all components of a computer or other electronic system into a single chip. As such, the host SoC 12 may include one or more processors, such as a microprocessor, that may control the processing of system functions and requests in the computing system 10.

As mentioned above, the host SoC 12 may be coupled to the memory devices 14. In certain embodiments, the host SoC 12 may be coupled to the memory devices 14 via channels 16. The channels 16 may include buses, electrical wiring, or the like.

Figure 2:
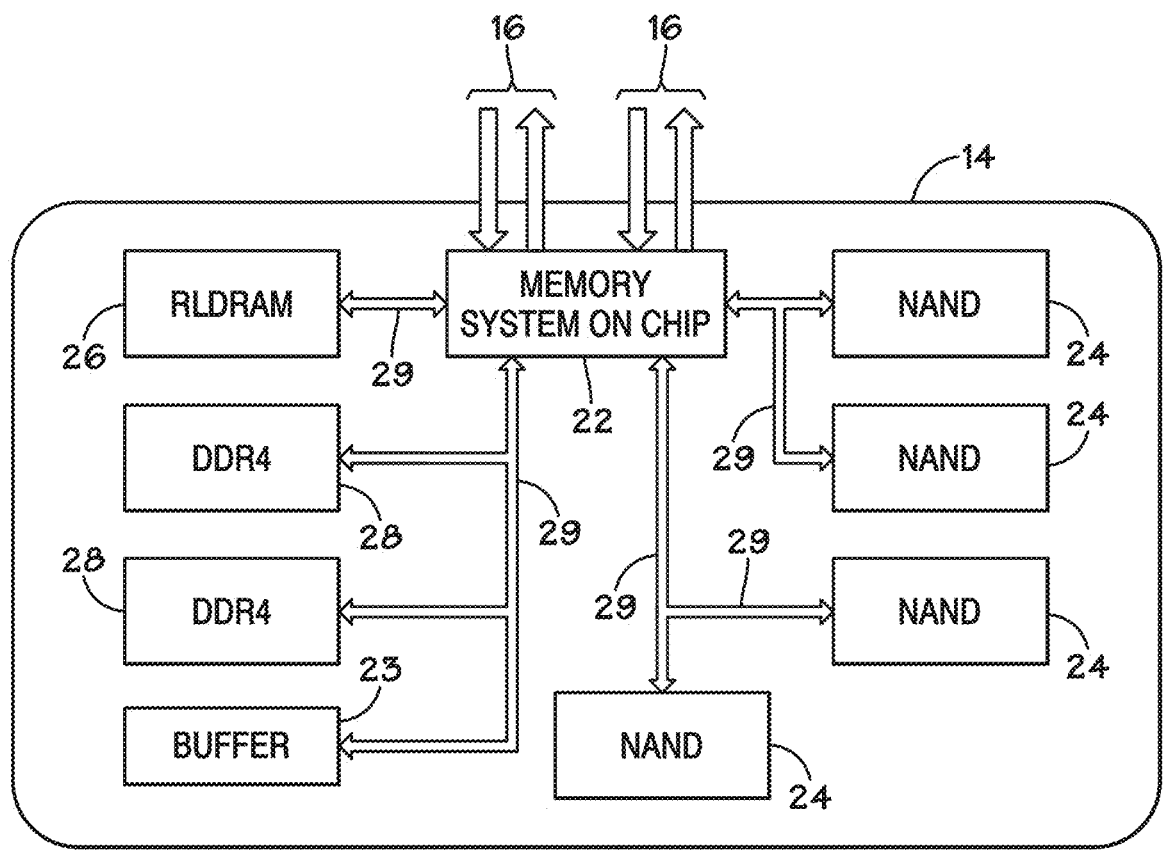
FIG. 2 illustrates a block diagram of an example of a memory device which may be part of the computing system of FIG. 1, in accordance with an embodiment.

FIG. 2 depicts a block diagram of an embodiment of the memory device 14. The memory device 14 may include any storage device designed to retain digital data. The memory device 14 may encompass a wide variety of memory components including volatile memory and non-volatile memory. Volatile memory may include Dynamic Random Access Memory (DRAM) and/or Static Random Access Memory (SRAM). Moreover, the volatile memory may include a number of memory modules, such as single inline memory modules (SIMMs) or dual inline memory modules (DIMMs).

The non-volatile memory may include a read-only memory (ROM), such as an EPROM, and/or flash memory (e.g., NAND) to be used in conjunction with the volatile memory. Additionally, the non-volatile memory may include a high capacity memory such as a tape or disk drive memory. As will be appreciated, the volatile memory or the non-volatile memory may be considered a non-transitory tangible machine-readable medium for storing code (e.g., instructions).

As shown in FIG. 2, in certain embodiments, the memory device 14 may include a system on chip (SoC) 22 that may be any suitable processor, such as a processor-in-memory (PIM) or a computer processor (CPU), tightly coupled to the memory components stored on the memory device 14. Generally, the memory SoC 22 may be on the same silicon chip as the memory components of the memory device 14. By merging the processing and memory components into the memory device 14, the memory SoC 22 may manage the manner in which data requests and responses are transmitted and received between the memory components and the host SoC 12. In certain embodiments, the memory SoC 22 may control the traffic between the memory components to reduce latency and increase bandwidth. As will be appreciated, the host SoC 12 and the memory SoC 22 may employ a scalable memory system protocol when controlling the transmissions between memory components and other devices in accordance with embodiments described herein. As such, the scalable memory system protocol may be operating on the channels 16 between the memory device 14 and the host SoC 12, as well as on channels 29 between the memory components and the memory SoC 22.

In certain embodiments, the memory device 14 may also include a buffer 23. The buffer 23 may store one or more packets received by the memory SoC 22. Additional details with regard to how the memory SoC 22 may use the buffer 23 will be described below with reference to FIGS. 15-17. By way of example, the memory device 14 may include memory types such as NAND memories 24, Reduced-latency Dynamic random access memory (RLDRAM) 26, double data rate fourth generation synchronous dynamic random-access memory (DDR4) 28, and the like.

In certain embodiments, the host SoC 12 and the memory SoC 22 may perform various operations based on computer-executable instructions provided via memory components, registers, and the like. The memory components or storage may be any suitable articles of manufacture that can serve as media to store processor-executable code, data, or the like. These articles of manufacture may represent computer-readable media (i.e., any suitable form of memory or storage) that may store the processor-executable code used by the host SoC 12 or the memory SoC 22 to perform the presently disclosed techniques. The memory and the storage may also be used to store the data, analysis of the data, and the like. The memory and the storage may represent non-transitory computer-readable media (i.e., any suitable form of memory or storage) that may store the processor-executable code used by the host SoC 12 or the memory SoC 22 to perform various techniques described herein. It should be noted that non-transitory merely indicates that the media is tangible and not a signal.

Although the following description of various aspects related to the scalable protocol is described herein as being performed with respect to the host SoC 12 and the memory SoC 22, it should be noted that all of the systems and techniques described herein may be performed using any suitable device. That is, the scalable protocol may facilitate communication between any two devices, such as communications between two processors, two memory modules, a processor and a memory module, and the like.

Packet-Level View of Packets in Scalable Protocol

Figure 3:
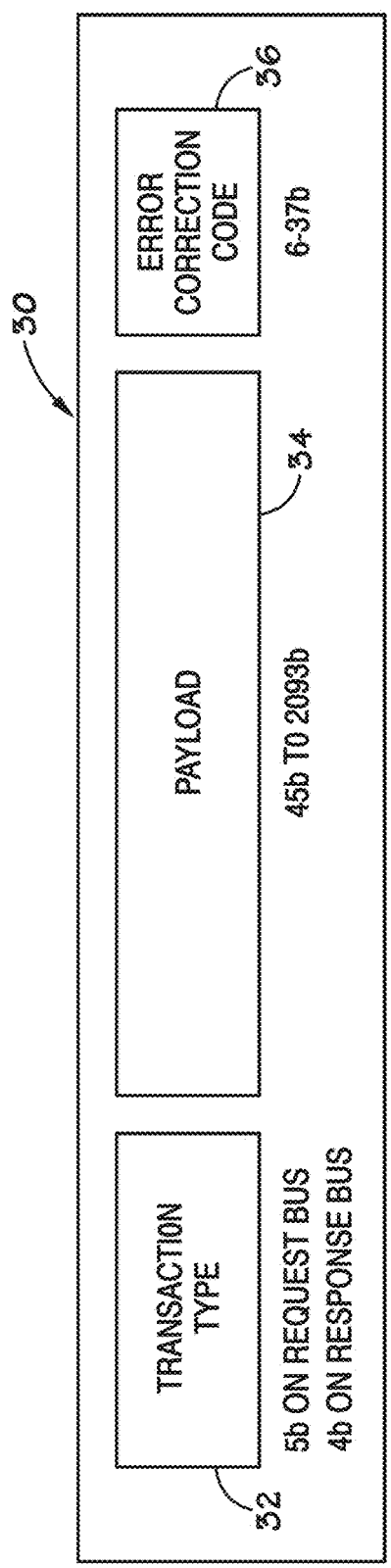
FIG. 3 illustrates a packet level view of a packet that may be transmitted within the computing system of FIG. 1, in accordance with an embodiment.

To employ the scalable memory system protocol when transmitting requests and responses involving the memory components, the memory SoC 22 may send packets of data structured according to a packet level view of a packet 30 illustrated in FIG. 3. As shown in FIG. 3, the packet 30 may include a transaction type field 32, a payload field 34, and an error control code (ECC) field 36. The transaction type field 32 may include data indicative of the type of transmittance, a type of packet being transmitted, or both. The transaction type field 32 may also indicate a packet size to indicate a number of bits in the data payload and the number of bits in the ECC field, thereby indicating the number of bits in the entire packet. In certain embodiments, the transaction type field 32 may indicate the size of the payload field 34 and the ECC field 36 in an indirect manner. For example, the data stored in the transaction type field 32 may serve as an index to a lookup table. The lookup table may provide information regarding the sizes of the payload field 34 and the ECC field 36. As such, the memory SoC 22 may, in one example, receive the packet 30 and use the data stored in the transaction type field 32 as an index to a lookup table that may be stored within the memory device 14 to determine the sizes of the payload field 34 and the ECC field 36.

In certain embodiments, the transaction type field 32 may specify different types of packets based on whether the packet is being transmitted on a request bus Q or a response bus S, which may include the channels 16, the channels 29, or the like. Generally, the request bus Q and the response bus S may be separate, unidirectional, or common inputs/outputs. The request bus Q generally includes q lanes, and the response bus S generally includes s lanes.

Example transaction type fields 32 for packets 30 transmitted on the request bus Q may include read operations (e.g., 8uRead, 8uRead2, varRead, where u might be an 8-bit unit or a 9-bit unit or possibly a non-integer unit size of data), message data (e.g., message), read-modify-write (RMW) operations (e.g., RMW1A, RMW2A, RMW3A, RMW4A), datasets (e.g., 32uData, 64uData, 128uData, 256uData), pattern write operations (e.g., 8uPatternWrite, 16uPatternWrite), write-with-enable operations (e.g., 8uWriteWithEnables, 16uWriteWithEnables), write operations (e.g., 8uWrite, 16uWrite, 32Write, 48uWrite, 64Write, 80uWrite, 96uWrite, 112uWrite, 128Write, 256Write), and the like. Providing 32Write operations and 64Write operations may provide more flexibility to a system designer in picking a maximum packet size. The scalable protocol may, in one embodiment, have a limit of 256Unit, but using a smaller maximum packet size may help with system latency. It should be understood that the difference between 32uWrite and 32Write is that 32uWrite is a single fixed size and the TransactionSize is not included in the packet. On the other hand, 32Write includes a TransactionSize and thus can involve additional 32 U chunks of data, not just the 32 U chunk included in the original request packet. Noting the listed transaction type examples above for the request bus Q, the packets 30 transmitted via the request bus Q may include a total of 26 native transactions (e.g., 8uRead, message, RMW1A, etc.), each of which may be represented using a 5-bit field for global (i.e., system that includes numerous CPU modules and/or numerous memory device modules in which packets may be relayed from unit to unit) or local systems (i.e., system that include few modules in which packets move point to point between units without relaying). As such, in one embodiment, the transaction type field 32 for a packet 30 on the request bus Q may be 5 bits.

In the same manner, example transaction type fields 32 for packets 30 transmitted on the response bus S may include message data (e.g., message), datasets (e.g., 8uData, 16uData, 32uData, 48uData, 64uData, 80uData, 96uData, 112uData, 128uData, 256uData), and the like. Again, noting the listed transaction type examples above for the response bus S, the packets 30 transmitted via the response bus S may include a total of 11 native transactions (e.g., message, 8uData, etc.), each of which may be represented using a 4-bit or 5-bit field for a local system. As such, in one embodiment, the transaction type field 32 for a packet 30 on the response bus S may be 4 bits.

Since the 26 request bus Q transaction types and the 11 response bus S transaction types include 5 of the same transaction types (e.g., message, 128uData, 256uData), the total number of transaction types used by the request bus Q and the response bus S may be 32. These 32 transaction types may thus be represented in a 5-bit field. Additional details regarding the transaction types will be discussed further below.

Referring again to FIG. 3, the packet 30 may also include a payload field 34 and an error control code (ECC) field 36. As mentioned above, the respective size of the payload field 34 and the ECC field 36 may be determined based on the data in the transaction type field 32. By way of examples, the payload field 34 may be approximately between 45 bits and 2093 bits, and the ECC field 36 may be approximately between 6 bits and 37 bits. The payload field 34 may include the data representative of the request or response being sent via the request or response bus, respectively.

The ECC field 36 may include the error control code to determine whether the packet 30 received by the receiving component includes any errors. As such, the error control code may include various algorithms, such as adding redundant data or parity data, to a message, such that the original data may be recovered by the receiving component even when a number of errors were introduced, either during the process of transmission, or on storage. Generally, the error control code may provide the ability to detect an error within the limits of the code and indicate a further action, such as retransmitting the errant packet, when the error is detected.

Transaction Type Field

As mentioned above, the scalable protocol may use packets that have a transaction type field to perform various types of operations more efficiently. Generally, the scalable protocol may enable an abstracted memory architecture to employ any memory type and incorporate various types of data processing using a single abstraction protocol. Keeping this in mind, the transaction type field 32 may be a useful piece of data to allow the scalable protocol to perform various types of data processing since the transaction type field 32 provides two distinct pieces of information. That is, the transaction type field 32 combines two data fields (i.e., type and size) into one for a minimum possible bit count occupancy in the protocol.

As will be shown below, the scalable protocol may support variable size packets for transmission efficiency. As such, it may be useful to indicate a size of the packet to the receiving component to prevent the system from becoming unsynchronized. Here, the transaction type field 32 may provide a single field that identifies the type of system transaction being performed and may implicitly define the packet size by virtue of the transaction type. In other words, the transaction type field 32 may indicate a type of transaction being requested by the transmitting component and the receiving component may then determine the size of the corresponding packet (e.g., payload field 34 and ECC field 36) based on the specified transaction type. As such, the transaction type field 32 may be a dual-purpose field employed by the scalable protocol to provide a bit-efficient manner to convey information.

In certain embodiments, the transaction type field 32 may also indicate additional information regarding data that may be provided in the payload field 34. For instance, based on the value of the transaction type field 32, transaction window information (window), address information (address), levels of indirection (levels) information, message type information, raw data, and other types of information may be ascertained to be part of the payload field 34. Details regarding the information that may be part of the payload field 34 will be discussed in greater detail below.

The scalable protocol may be employed in a system having one or more request bus Q transactions and one or more response bus S transactions. Although the request bus Q and the response bus S has been described above as having a 5-bit field and a 4-bit field, respectively, it should be noted that the request bus Q and the response bus S may be designed to have a variety of different bit sizes. By way of example, request bus Q transactions may be indicated using a 5-bit field (e.g., 00000, 00001, . . . , 11110, 11111), such that possible transaction types that may be associated with the 5-bit field as follows (where data unit u size is 8 bits):

01011—8uRead—8B data read operation, provide additional fields (e.g., sub-fields within the payload field 34): Window, Address, Levels (levels of indirection)

01101—varRead—variable data size read operation, provide additional fields: TransactionSize, Window, Address, Levels 00000—Message—general message, provide additional fields Window, MessageType, Data (Data is constrained only by the field size, e.g. data for the Nack message type may include DataSequence, OriginatingTransactionType, OriginatingWindow)

01110—RMW1A—read-modify-write request with single address incorporated, provide additional fields: TransactionSize, Window, Address, OpCode, ImmediateData 01100—8uRead2—two 8B data read operations, provide additional fields: First_Window, First_Address, First_Levels, Second_Levels, Second_Address 10110—8uWrite—write request including 8B data, provide additional fields: Window, Address, Levels, 8B data 10010—8uWriteP—write request including 8B data to be written once or more, provide additional fields: Window, Address, TransactionSize, Levels, 8B data 01111—RMW2A—read-modify-write request with two addresses incorporated, provide additional fields: TransactionSize, First_Window, First_Address, OpCode, ImmediateData, Second_Window, Second_Address 10100—8uWriteEn—write with WriteEnableBits and 8B data, provide additional fields: Window, Address, Levels, 8 enable bits, 8B data 10000—RMW3A—read-modify-write request with three addresses incorporated, provide additional fields: TransactionSize, First_Window, First_Address, OpCode, ImmediateData, Second_Window, Second_Address, Third_Window, Third_Address 10111—16uWrite—write request including 16B data, provide additional fields: Window, Address, Levels, 16B data 10011—16uWriteP—write request including 16B data to be written once or more, provide additional fields: Window, Address, TransactionSize, Levels, 16B data 10101—16uWriteEn—write with WriteEnableBits and 16B data, provide additional fields: Window, Address, Levels, 16 enable bits, 16B data 10001—RMW4A—read-modify-write request with four addresses incorporated, provide additional fields: TransactionSize, First_Window, First_Address, OpCode, ImmediateData, Second_Window, Second_Address, Third_Window, Third_Address, Fourth_Window, Fourth_Address 00011—32uData—extended data packet, provide additional fields: Window, 32B data. Note that a data sequence number is not explicitly transmitted because the extended data packets are transmitted in order, thus, the receiver can append a sequence. If a subsequent NACK is required, the implicit sequence number is used as a reference.

11000—32Write—write request including 32B data, provide additional fields: Window, Address, Levels, 32B data, TransactionSize 11001—48uWrite—write request including 48B data, provide additional fields: Window, Address, Levels, 48B data 00101—64uData—extended data packet, provide additional fields: Window, 64B data. Note that a data sequence number is not explicitly transmitted because the extended data packets are transmitted in order, thus, the receiver can append a sequence. If a subsequent NACK is required, the implicit sequence number is used as a reference.

11010—64Write—write request including 64B data, provide additional fields: Window, Address, Levels, 64B data, TransactionSize 11011—80uWrite—write request including 80B data, provide additional fields: Window, Address, Levels, 80B data 11100—96uWrite—write request including 96B data, provide additional fields: Window, Address, Levels, 96B data 11101—112uWrite—write request including 112B data, provide additional fields: Window, Address, Levels, 112B data 01001—128uData—extended data packet, provide additional fields: Window, 128B data. Note that a data sequence number is not explicitly transmitted because the extended data packets are transmitted in order, thus, the receiver can append a sequence. If a subsequent NACK is required, the implicit sequence number is used as a reference.

11110—128Write—write request including 128B data, provide additional fields: Window, Address, Levels, 128B data, TransactionSize 01010—256uData—extended data packet, provide additional fields: Window, 256B data. Note that a data sequence number is not explicitly transmitted because the extended data packets are transmitted in order, thus, the receiver can append a sequence. If a subsequent NACK is required, the implicit sequence number is used as a reference.

11111—256Write—write request including 256B data, provide additional fields: Window, Address, Levels, 256B data, TransactionSize The listed example transaction types are provided in order of the ensuing packet size (barring any unintentional ordering errors) assuming a 5-bit transaction type, a 4-bit transaction size, a 3-bit window, a 48-bit address, 7-bit data sequence number, and extra bits in the data field which are specifically stated for each transaction type. Moreover, as mentioned above, the packet 30 may include the ECC field 36, which may be a fixed size as in conventional protocols. However, as will be appreciated, in certain embodiments, the ECC field 36 may be a variable size as will be discussed in greater detail below.

Keeping the foregoing in mind, response bus S transactions may be indicated using a 4-bit field (e.g., 0000, 0001, . . . , 1110, 1111). If, however, the transaction type field 32 is 5 bits, the transaction type field 32 may simply include an extra leading zero. Example 4-bit transaction types for response bus S transactions may include:

0000—Message—general message, provide additional fields: Window, MessageType, Data (note that there are numerous message types such as Completion, ReOrder, NACK, and others)

0001—8uData—8B data response, provide additional fields: Window, 8B data

0010—16uData—16B data response, provide additional fields: Window, 16B data

0011—32uData—32B data response, provide additional fields: Window, 32B data

0100—48uData—48B data response, provide additional fields: Window, 48B data

0101—64uData—64B data response, provide additional fields: Window, 64B data

0110—80uData—80B data response, provide additional fields: Window, 80B data

0111—96uData—96B data response, provide additional fields: Window, 96B data

1000—112uData—112B data response, provide additional fields: Window, 112B data

1001—128uData—128B data response, provide additional fields: Window, 128B data

1010—256uData—256B data response, provide additional fields: Window, 256B data

Like the example transaction types listed above for the request bus Q transactions, the example response bus S transactions above are listed in order of the ensuing packet size assuming a 5-bit transaction type on the request bus Q, a 4-bit transaction type on response bus S, a 4-bit transaction size, a 3-bit window, a 48-bit address, a 7-bit data sequence number, and extra bits in the data field which are stated specifically for each transaction type.

As shown above, each transaction type may be associated with a different length packet depending on individual field size assumptions. As a result, the scalable protocol may avoid using an additional field to indicate a packet size. Conversely, in a protocol having 8-bit flits, the flit count of the request bus Q packets would be, in order of transaction type, as follows: 8, 8, 9, 11, 13, 16, 16, 17, 18, 21, 24, 25, 26, 27, 41, 57, 73, 89, 105, 121, 132, 138, 260, 266. This protocol may then include a packet size field that may be 9 bits in size to indicate the flit count of each packet. Alternatively, the packet size field may be 5 bits in size to differentiate each of the 24 different lengths and then a translation function may be used to determine an exact flit count. Unlike conventional protocols, the scalable protocol may not employ a packet size field. Instead, the system may use a translation function to determine a packet's size based on the transaction type and may then save the protocol bits.

Transaction Windows

In addition to providing improved bit-efficiency with regard to error control codes, the scalable protocol may organize packets according to their respective transaction types and transmit the organized packets according to a particular order based on their respective transaction types. In conventional protocols, requests may be ordered according to a time at which they have been transmitted. In this case, if the first request involves a high latency and the following request (i.e., second request) involves a low latency, the second request may have to wait for the first request to finish even though it may be completed more quickly than the first request. As a result, the first request may choke the bus. In other words, the first request may prevent the bus from responding to relatively low latency requests, even though the low latency requests may be resolved more quickly than the higher latency requests.

To provide a more efficient manner in which to mix different types of transaction requests within the bus, the scalable protocol may use transaction windows to determine an order in which requests are serviced. A transaction window may be a virtual channel implemented using a virtual address space. Each transaction window may be associated with a respective memory device, such as NAND and DRAM. As such, a single transaction window may be associated with a memory or memories having the same characteristics, such as latency, bandwidth, granularity, persistence, and the like.

Generally, the transaction window may provide information related to a certain set of rules of engagement for each particular transaction. As mentioned above, the transaction window data may specify a set of lanes of a physical bus (e.g., channels 29) being used to transmit and receive packets for particular transactions. The set of lanes specified by the transaction window may be referred to as a virtual channel accessible to the memory device 14. It should be noted that the channels 29 described herein includes one or more lanes in which data may be transferred. Using the transaction window data to characterize certain features (e.g., ordering) related to the transmission or reception of packets, the scalable protocol may better manage the transmission of packets between processors.

Figure 4:
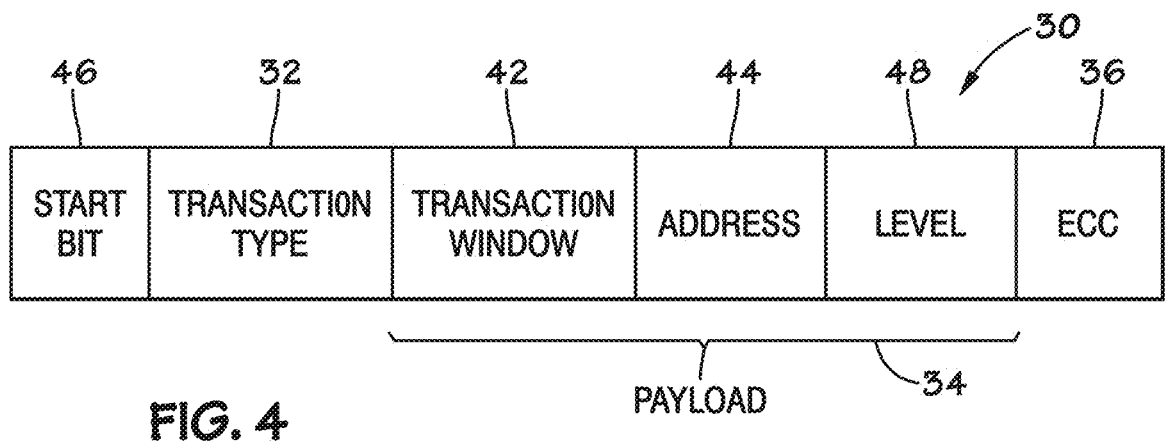
FIG. 4 illustrates a detailed packet level view of the packet that may be transmitted within the computing system of FIG. 1, in accordance with an embodiment.

For instance, since each type of memory device has a different latency, it may be beneficial to manage the flow of bus traffic between various types of memory devices 14 and the host SoC 12 based on respective latencies of the respective memory devices. By way of example, DRAM devices generally have fast latencies (e.g. 50 ns from a random request), while NAND devices generally have slow latencies (e.g. 500 us) with error correction after a random request. SRAM buffers have faster latency of 10 ns. Keeping this in mind, the scalable protocol may designate a transaction window for each memory device. In one embodiment, the scalable protocol may use two fields to designate each transaction window: a 48-bit Address and a 3-bit Window (i.e., addressing Windows 0 through 7). FIG. 4 illustrates a block diagram that depicts the two fields that designate the transaction window in the packet 30. As shown in FIG. 4, a transaction window field 42 and an address window field 44 may be part of the payload field 34. The transaction window field 42 may specify a designated transaction window and the address window field 44 may specify the 48-bit address associated with the specified transaction window. The 48-bit address may be a virtual address assigned to a virtual channel (i.e., window). In one embodiment, the virtual address space may reference a physical address located on a hard disk drive or some other storage device. As such, the memory device may have the ability to store more data than physically available.

In addition to the transaction window field 42 and the address window field 44, the packet may include a start bit 46 and a level of indirection field 48. The start bit 46 may indicate the beginning of a packet in a stream of bits. The level of indirection field 48 may be part of the payload field 34 and may provide a value that indicates a number of levels of indirection the respective transaction may include. Additional details regarding the start bit field 46 and the level of indirection field 48 will be discussed in greater detail in other sections below.

Generally, each type of memory device may be assigned to a different transaction window. By way of examples, DRAM0 may be assigned into Window0, DRAM1 into Window1, DRAM2 into Window2, NAND0 into Window3, NAND1 into Window4, and SRAM buffers and control registers into Window7. With this in mind, an example set of transactions may be sent according to the following sequence:

(1) Read.Window0.AddressA
(2) Read.Window3.AddressB
(3) Read.Window0.AddressC
(4) Read.Window0.AddressD
(5) Read.Window0.AddressE
(6) Read.Window0.AddressF
(7) Read.Window3.AddressG
(8) Read.Window0.AddressH
(9) Read.Window0.AddressI As shown above, transactions 1, 3-6, 8, and 9 are part of Window0, which corresponds to a DRAM memory device. Transactions 2 and 7, on the other hand, are part of Window3, which corresponds to a NAND memory device. Upon receiving the above requests, the receiving component may respond to the received requests using ordering rules established according to the respective transaction windows specified for each transaction. As such, the receiving component may use the transaction windows to provide a local ordering protocol between the transmitting component and the receiving component.

In one embodiment, the ordering rules specified for a particular transaction window may be based on the respective latency associated with the respective transaction window. That is, the receiving component may respond to the requests involving lower latencies first before responding to the requests having longer latencies. Since the receiving component may be aware of the latency differences between each transaction window, the receiving component may decide to receive the transactions according to their window designations. As such, referring again to the example transactions described above, the receiving component implementing the scalable protocol may respond to the above requests as follows:

(1) Data.Window0.AddressA
(3) Data.Window0.AddressC
(4) Data.Window0.AddressD
(5) Data.Window0.AddressE
(6) Data.Window0.AddressF
(8) Data.Window0.AddressH
(9) Data.Window0.AddressI
(2) Data.Window3.AddressB
(7) Data.Window3.AddressG As shown above, the receiving component may first respond to the low-latency requests of Window® before responding to the higher latency requests of Window3. That is, the long latency requests may be transmitted later than the short latency requests. As a result, the system bus servicing the requests is not hampered by the presence of different classes of memory on the same bus without adding various elaborate protocol complications, such as adding a field with REQUEST PRIORITY. In this way, the scalable protocol provides a complex system operation using a minimal number of bits in a relatively simple manner.

In another example, the receiving component may employ a local ordering scheme based on a corresponding transaction window specified for each transaction. For the following transaction:

(1) Read8b.Window1.AddressA
(2) Read8b.Window2.AddressB
(3) Read8b.Window1.AddressC The receiving component may first receive transaction (1) and determine whether AddressA is available. If AddressA is busy, the receiving component may store transaction (1) in a queue and wait for AddressA to become available. In the meantime, the receiving component may then receive transaction (2) and perform the read operation if AddressB is available. The receiving component may then receive transaction (3) and since it is associated with the same window as transaction (1), the receiving component may determine whether there are any ordering conflicts with regard to performing transaction (3) before transaction (1) because they are part of the same transaction window. In the same manner, the receiving component may disregard any potential ordering conflict or the determination of any potential ordering conflict with transaction (2) because it is part of a different transaction window. As such, the transaction windows may provide a more efficient way for data operations to be performed while different transactions are being performed. That is, since the transaction windows allow operations to be logically grouped with related operations or memory devices, operations may be performed in a variety of orders, thereby providing a flexible way to complete transactions. In contrast, conventional protocols typically enforce a strict order of data operations to be performed according to the order in which the transactions were sent even though different transactions may be performed in a variety of orders or may process transactions based on the inclusion of priority information sent in a dedicated protocol field.

In one embodiment, the scalable protocol may provide an ability to assign a minimum transaction size for each window (e.g., Window0.Size=8 Bytes, Window3.Size=128B). For example, if a minimum transfer size for Window® is 8 bytes, for a 48b address field, Window® may store 2^48*8 bytes=~2.25×1015 bytes. In the same manner, if a minimum transfer size for Window3 is a 128 bytes, Window3 may support ~3.6×1016 bytes. As such, both Window® and Window3 support considerably more bytes than the address space implies.

Another feature associated with the transaction window includes a simple system-level addressability of other spaces such as Window® SRAM and system control registers without creating additional commands in the protocol. That is, SRAM and system control registers may be addressed by simply using Window0. Prior protocols, on the other hand, may use additional commands such as register.read and register.write to interact with these types of memories. With the designated transaction window for these memory types, the same read and write commands used for other memory devices may also be used for SRAM and system control registers. That is, the read and write commands may simply point to an appropriate window. As such, the scalable protocol may employ fewer commands, thereby reducing the number of bits used in the protocol.

By organizing data transactions according to transaction types, multiple transaction windows may provide multiple avenues of access to the same memory type. For example, a typical DDR3 DRAM may include eight banks, and an internal bus may include eight such DRAMs. With this in mind, the eight DRAMS may be organized such that Window1 represents bank 0 of a group of eight DDR3 DRAMs and Window2 provides access to bank 1 of this same group. In this way, each window may specify a particular virtual address space of each DRAM. With this in mind, it is clear that a number of suitable grouping methods are available since there could be any number of DRAMs grouped in a lock-step operation, each with pages, banks and ranks. In the same manner, NANDs may also be grouped with pages, planes, and blocks. Furthermore, multichannel devices can be further separated per channel and various aggregations thereof. Generally, the grouping options may be determined based on a complexity of logic chip design.

By supporting multiple transaction windows having multiple virtual address spaces and virtual channels, the scalable protocol may use the transaction windows to establish predictable data ordering in a system that contains memories that have different latencies. As a result, the scalable protocol may support high and low priority requests without having an explicit protocol field that specified how the high and low priority requests are ordered.

Figure 5:
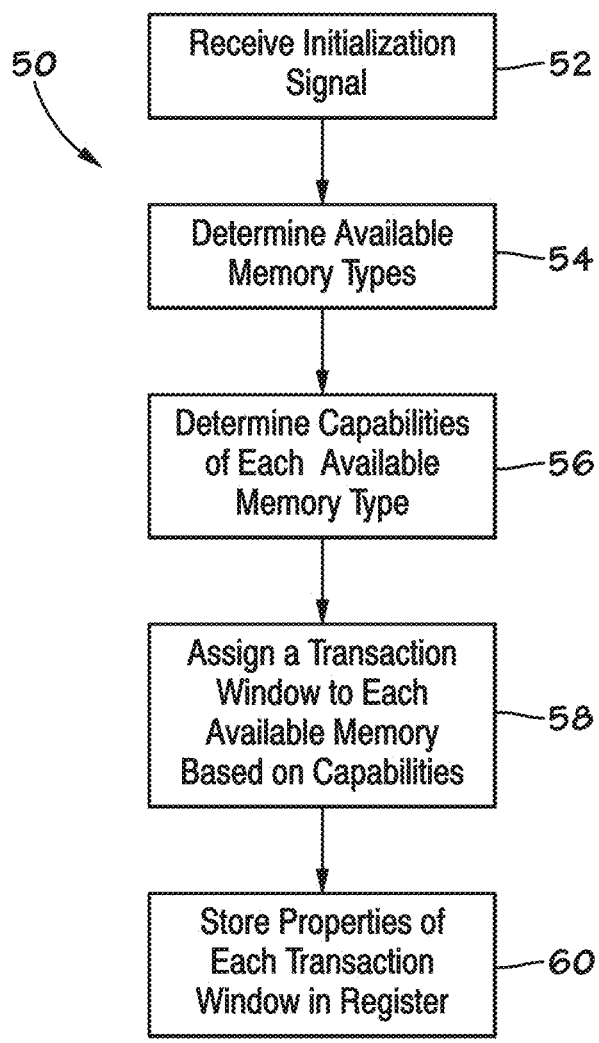
FIG. 5 illustrates a flow chart of a method for assigning transaction windows for various types of memories that are part of the memory device of FIG. 2, in accordance with an embodiment.

With the foregoing in mind, FIG. 5 illustrates a flow chart of a method 50 for assigning transaction windows for various types of memories that are part of the memory device 14. Although the method 50 is depicted in a particular order, it should be noted that the method 50 may be performed in any suitable order, and thus, is not limited to the order depicted in the figure. Additionally, the following description of the method 50 will be described as being performed by the memory SoC 22 for discussion purposes. As such, any suitable processor that is communicatively coupled to various types of memories may perform the operations described in the method 50.

Referring now to FIG. 5, at block 52, the memory SoC 22 may receive an initialization signal from registers or other memory components stored within the memory SoC 22 itself. In one embodiment, the initialization signal may be received by the memory SoC 22 upon power up or when the memory device 14 initially receives power.

At block 54, the memory SoC 22 may determine the memory types that it may be able to access. That is, the memory SoC 22 may scan its communication lanes (e.g., channels 29) and identify the different types of memories that may be communicatively coupled to the memory SoC 22. Referring back to the example memory device 14 depicted in FIG. 2, the memory SoC 22 may determine that the RLDRAM 26, the DDR4 28, and the NAND 24 memory types are coupled to the memory SoC 22.

At block 56, the memory SoC 22 may determine the capabilities of each of the memory types identified at block 54. The capabilities of the memory types may include a capacity of the memory type, an expected latency for a read operation using the memory type, an expected latency for a write operation using the memory type, and the like. Other capabilities that may be identified by the memory SoC 22 for use in assigning transaction windows may include read latency, write latency, bandwidth, minimum read transaction size, minimum write transaction size, device cycle time, writeable in place or not, byte write capability or not, and the like. In certain embodiments, each different type of memory may be associated with a different set of capabilities. The associations between the different types of memories and the different sets of capabilities may be stored in a register of the memory SoC 22 or may be provided by each respective memory type.

After determining the capabilities of the memory types, the memory SoC 22 may, at block 58, assign a transaction window to each memory type identified at block 54 based on the respective capabilities of each memory type. Generally, the memory SoC 22 may assign each similar memory type to the same transaction window. That is, since each similar memory type has similar capabilities, the memory SoC 22 may assign the memory type to the same transaction window. For example, referring again to the example memory device 14 of FIG. 2, the memory SoC 22 may assign the two DDR4 28 memories to the same transaction window because they are identical memory types. In the same manner, if two different memory types have a certain number of similar capabilities, the memory SoC 22 may also assign the two memory types to the same transaction window.

In one embodiment, the memory SoC 22 may assign a memory type to a corresponding transaction window based on desired operations of the memory SoC 22. For instance, if the memory SoC 22 desires that all read operations have at least a particular latency, the memory SoC 22 may assign each identified memory type into a first transaction window that meets this latency threshold or into a second transaction window that does not meet this latency threshold.

After assigning a transaction window to each identified memory type, the memory SoC 22 may proceed to block 60 store properties of each transaction window in a storage device. The storage device may include any suitable device capable of storing data. As such, the storage device may include a local register, a table, or some other information storage unit. In this way, the memory SoC 22 may perform operations for each memory type according to ordering rules as described above. In some cases, the stored properties may detail certain capabilities of each transaction window along with other relevant information regarding the operation of each transaction window.

Programmable Number of Levels of Indirection

Although the packet 30 has been described above as having the transaction type field 32, the payload field 34, and the ECC field 36, in certain embodiments, the scalable protocol may include other optional fields into the packet 30 to condition a request, such as a read, write, move, read-modify-write, and the like. One such condition may include indicating a number of levels of indirection to apply to a request.

Levels of indirection may indicate a number of pointers between the request and the data being requested. Given the sheer amount of data available in computing systems (e.g., Big Data), data is often indexed via multiple tables and stored in one location. That is, in a Big Data system, a request for a particular dataset may include a pointer that points to a second pointer (e.g., link list), which points to a third pointer, etc. Eventually, the last pointer in the pointer sequence may point to an address of the requested dataset. Each pointer-to-pointer link may be referred to as a level of indirection. The process of identifying the requested dataset through each level of indirection is often referred to as "pointer chasing."

From the perspective of the requesting component, the requesting component may initially send a request for the particular dataset with a first pointer. In response to the request with the first pointer, the requesting component may receive the second pointer. As such, the requesting component may then send a second request for the particular dataset with the second pointer. This process may continue until the requesting component receives the particular dataset. Accordingly, the traffic on the request bus Q may involve multiple requests before actually receiving the dataset requested by one single initial request.

To reduce the amount of bus traffic with regard to various levels of indirection type request, the scalable protocol may specify within a design of an application-specific integrated circuit (ASIC), the memory SoC 22, the host SoC 12, or the like that implements the scalable protocol an indication of a number of pointers that the requesting component may receive before actually receiving the requested data. As such, the memory system implementing the scalable protocol may identify the pointer chain between the original request and the location of the data and may service the request to the requested data based on the initial request from the requesting component. That is, one request, involving any number of levels of indirection from the requesting component may result in receiving just one response that includes the requested data.

Keeping this in mind, the optional field indicating the number of levels of indirection may include 2 bits. In one embodiment, binary 00 may indicate no levels of indirection or that the supplied address in the request is the actual address of the intended operand. Binary 01 may indicate 1 level of indirection or that the data at the location specified by the address within the request is actually the address (e.g., final address) of a pointer and the intended operand address is contained in that pointer. For example, in a read request having 1 level of indirection, the actual function performed by the requesting component may first include reading the contents of an address contained in the request. In this example, the content of the address may be Address2. The memory system implementing the scalable protocol may then read the contents at the memory location of Address2, and the content of the memory location of Address2 is supplied as the result of the read request.

In the same manner, binary 10 may indicate 2 levels of indirection. Here, the supplied address may point to Address2, which may be a pointer. That is, the Address2 may include a pointer that points to Address3. The data content at Address3 may then be supplied to the requesting component as the result of the read request.

Binary 11 may indicate 3 levels of indirection. As such, the supplied address may point to Address2, which may point to Address3, which may point to Address4, which may include the data content. The memory system implementing the scalable protocol may provide the data content to the requesting component as the result of the read request.

In the instance of a write request, the process performed by the memory system implementing the scalable protocol may be the same as the described read example. For instance, with an indirection level field set to binary 11, the memory system may perform a write operation by first reading an address of the write request (e.g., Address2). Knowing that the indirection level field is 11, the memory system may continue to read the content of Address2, which may refer to Address3. The memory system may then read the content of Address3, which may refer to Address4. The memory system may then write the data of the write request into the memory of Address 4. As such, in this example, the write request may include 3 reads before the write, but each of the 3 reads were initiated by a single write request. Although the indirection field has been described as having two bits, it should be noted that the indirection field may include any number of bits, to indicate any number of levels of indirection.

As mentioned above, the levels of indirection may be specified within the level of indirection field 48 of the payload field 34, as illustrated in FIG. 4. The number of levels of indirection specified within the level of indirection field 48 corresponds to a number of levels of indirection that the memory system may expect to encounter when retrieving the contents of the memory location.

In one embodiment, the number of bits (e.g., size) used by the level of indirection field 48 may be determined based on a preference provided by the host SoC 12. For instance, upon power up, the host SoC 12 may discover the memory SoC 22 and determine that the memory SoC 22 is operating using the scalable protocol described herein. As such, the host SoC 12 may determine a maximum number of levels of indirection that it may be able to accommodate without compromising its performance. The maximum number of levels of indirection may be determined based on the write and/or read latencies of the host SoC 12 or other operating parameters of the host SoC 12. If, for example, the host SoC 12 determines that the maximum number of levels of indirection is 3, it may specify to the memory SoC 22 to use a 2-bit field for the level of indirection field 48. In some instances, the host SoC 12 may not have a preference with regard to operations involving any number of levels of indirection. In this case, the host SoC 12 may specify to the memory SoC 22 not to include the level of indirection field 48.

When preparing the packet 30 to transmit, the memory SoC 22 may determine the cause for the packet 30 to be transmitted. As such, the memory SoC 22 may determine what software command was used for the transfer of the packet 30. The software command that generates the packet may correspond to a command to look up a pointer of a pointer, for example. The memory SoC 22 may interpret this command as having two levels of indirection and thus may provide a 10 binary value in the level of indirection field 48 when preparing the packet 30 for transmission.

The levels of indirection may be useful for various types of operations. By way of example, arrays of arbitrary dimensions may use levels of indirection to assist requesting components identify the content of their respective requests without adding unnecessary traffic to the respective bus. For instance, a 3-dimensional array may use three pointers to access data. Records of some defined structures may use pointers. One example of such a record may include link lists that have a head and tail pointer for every structure in the list. For linked lists, the abstraction of levels of indirection may enable the parsing of the link list to occur more efficiently. That is, by knowing an address in which to start and that the requested data is located at a destination that is the 8th element of the list or involving 8 levels of indirection, the memory system may retrieve the requested data or the 8th element of the list using the single request provided by the requesting component. Here, the memory system may parse each of the 8 levels of indirection to determine the location of the requested data. Upon identifying the location of the requested data, the memory system may provide the requesting component the requested data, thus limiting the bus traffic to one request from the requesting component and one response from the location of the requested data.

Not Acknowledging Received Packets

Another technique for reducing bus traffic may include not acknowledging received packets. That is, in conventional protocols, each packet that has been received by a recipient component may send an acknowledgment packet back to the transmitting component. Since the vast majority of transmitted packets are received by the corresponding recipient component, sending acknowledgment packets may add to the traffic on the respective bus without providing much of a benefit.

For instance, if an acknowledge bit is sent in response to receiving every successful packet, and considering that the transmissions have a Bit Error Rate (BER) of 1e-12, which is common in very high speed interfaces, a large number of unnecessary bits are transmitted to indicate that each packet has been received. Keeping this in mind, and assuming that an average packet includes 100 bits and that the average packet error rate is approximately 1e-10, the recipient component may transmit an acknowledge bit indicating success for 1×1010 packets and 1 packet indicating an error. Effectively, the recipient component may have sent about 1×1010 bits to indicate one error.

To reduce the amount of bits flowing within a bus, the recipient component may not send an acknowledgment packet for every received packet. Instead, the transmitting component may assume that the packet sent has been received unless otherwise notified by the recipient component. Examples of not sending acknowledgement packets for each received packet are illustrated in FIGS. 6 and 7. Referring to FIG. 6, the request bus Q may send a read request of 2 kilobytes. Upon receiving the read request, the response bus S may transmit a packet indicating that the 2 KB message is ready for reading. The request bus Q may then retransmit the read request, which may cause the response bus S to send the requested data in different packets. As shown in FIG. 6, upon receiving each packet of the data, the request bus Q does not send an acknowledgement packet indicating that the packet was received successfully. Here, since the request bus Q may be operating with high latency read operations, the response bus S may include two stages for the operations. That is, the response bus S may indicate that the message is ready and then the response bus S may send the corresponding data related to the read request.

In the same manner, high latency direct memory access subsystems may employ a one stage response for various write operations. For instance, FIG. 7 illustrates an example in which a read-modify-write request is transmitted on the request bus Q and responded with a message that the read-modify-write request is complete.

Keeping the foregoing in mind, the recipient component may still receive packets that have errors. As such, the recipient component may notify the transmitting component that the packet has not been received or that the received packet contains an error by sending a NOT_ACKNOWLEDGE packet to the transmitting component. In addition to indicating that the sent packet has not been received, the NOT_ACKNOWLEDGE packet may indicate a most recent known-to-be-good bus transaction. As such, when an error is detected via an ECC subsystem, the packet having the error should be re-transmitted. The recipient component may identity the transmitting component of the most recent successful bus transaction as a reference to so that a retransmission can occur.

In certain embodiments, the scalable protocol may use 4 relevant fields to indicate to a transmitting component the identity of the last known-to-be-good bus transaction. The relevant fields include a window, an address, a transaction, and an optional data sequence number. These four fields may identify any request/response in the system. In certain embodiments, an additional ECC field may be used to detect an error in the transmission (e.g., a code which is guaranteed to detect the presence of 1, 2, 3, 4, or 5 random errors in the transmission packet, also known as an HD6 code, as will be described in more detail below).

Upon detecting an error, the recipient component may send a NOT_ACKNOWLEDGE message to the transmitting component. The size of this packet may be many possible field sizes. For instance, the NOT_ACKNOWLEDGE message may be a 4-bit transaction type, a 3-bit window, a 48-bit address, a 7-bit data sequence number, and a 5-bit original transaction type for a sum of 67 bits. Then a 15-bit ECC field may be added, thereby bringing the total to 82 bits. Referring back to the example above, 82 bits is significantly lower than the 1×1010 bits sent for indicating one error in 1×1010 packets, and thus is a more efficient way to indicate address error packets. It should be noted that the data sequence number mentioned above may identify the erroneous packet. Additional details regarding the data sequence number and how it may be generated will be discussed below with reference to FIGS. 12-14.

Upon detecting the error in the system, the transmitter component should retransmit the data. However, since there is some latency in detecting the error, the transmitting component may have already transmitted other packets before the recipient component determined that an error was present in a received packet. Since the scalable protocol includes variable packet sizes sent using data packing techniques described above, a previous transmission error could cause the recipient component to have a wrong packet length, and hence misinterpret every data packet after the packet containing the error. As such, the receiving component may indicate to the transmitting component an identity of the most recent known-to-be-good bus transaction to the recipient component. The transmitting component and receiving component may then return to a point at which the packet in error has been received and prevent any action from occurring on the potentially erroneous packet and packets which follow it.

Due to this rule of referencing the last known good bus transaction, the recipient component may accurately indicate to the transmitting component the correct point at which a retransmission may occur. However, the recipient component may incorporate one exception for the above rule when there has been no good transaction (e.g., the first transaction since power-on or reset was unsuccessful). In this case, the recipient component may populate all fields with 0's, such that all elements of the system will interpret the field of 0's as a "first transaction."

As mentioned above, the scalable protocol may include an optional data sequence number field. This field may support transactions that are desired to be larger than a largest response packet supported by the protocol. For example, consider a minimum transaction in a Window as being 128 bytes and another field called Size that dictates a size of a transaction, the total transaction size may be determined as $2^{\wedge}Size*windowMinTransactionSize$. If Size is a 3-bit field, the maximum transaction could be $2^{\wedge}7*128=16,384$ bytes. To prevent any bus from being tied up too long by one request, the largest single packet supported by the protocol may be 128B of data. Hence, the 16,384 byte transaction may be satisfied by 128 data packets of 128B each. In one embodiment, the optional data sequence number field may include 7 bits that reference any one of these 128 data packets. In this manner, if a NOT_ACKNOWLEDGE message is issued, the NOT_ACKNOWLEDGE message may correctly identify an exact point at which the transmission became unsuccessful. In another embodiment, the minimum TransactionSize of 8B, for TransactionSize 0 through 15, may be 8 bytes, 16 bytes, 32 bytes, 48 bytes, 64 bytes, 80 bytes, 96 bytes, 112 bytes, and 128 bytes, as opposed to $2^N$ bytes to conserve bits on the lower end.

Data Packing

Keeping the foregoing in mind, to provide flexible communication buses, the scalable protocol may employ data packing techniques when transmitting packets using any type of bus communication. Generally, since packet sizes are determined based on the type of request or response being sent, the data being sent, the operations being requested, etc., it may be difficult to anticipate what type of data channels to use before knowing more details regarding the packet. As such, the scalable protocol may be designed to maximize the use of the available channels by packing the data packets being transmitted together without padding each individual packet with zeros, as done with conventional protocols. As used herein, the term "without padding" means that between the transmission of data packets, zeros (i.e., bits having the value of zero) are not transmitted across a respective channel. Instead, the next scheduled packet ready to be transmitted will be transmitted on the clock cycle immediately after the previous packet is transmitted.

For example, consider a request bus Q that includes 10 signal lanes and a response bus S that includes 8 signal lanes. The present example assumes that there is no data encoding and that the transactions include only simple bit transmissions (i.e., no symbol transmissions). If the sizes of occupancy on the Q bus are: 4.3, 7.3, 9.7, 13.5, 14.3, 14.9, 20.0, 20.1, 21.6, 33.0, 36.2, 58.8, 65.2, 105.4, 110.5, and 123.0, a conventional protocol may pad the values having fractional components associated with them. That is, the conventional protocol may add zeros to the remaining portion of each fractional value such that the sizes of occupancy on the Q bus become 5, 8, 10, 14, 15, 15, 20, 21, 22, 33, 37, 59, 66, 106, 111, and 123, respectively. In some cases as many as 9 zeros may be added to the transmission, which may adversely impact an overall bus utilization efficiency because the transmitted zeros are not truly representative of data being transmitted. In this manner, these zeros utilize the bus without conveying information, thereby reducing the bus utilization efficiency.

Figure 8:
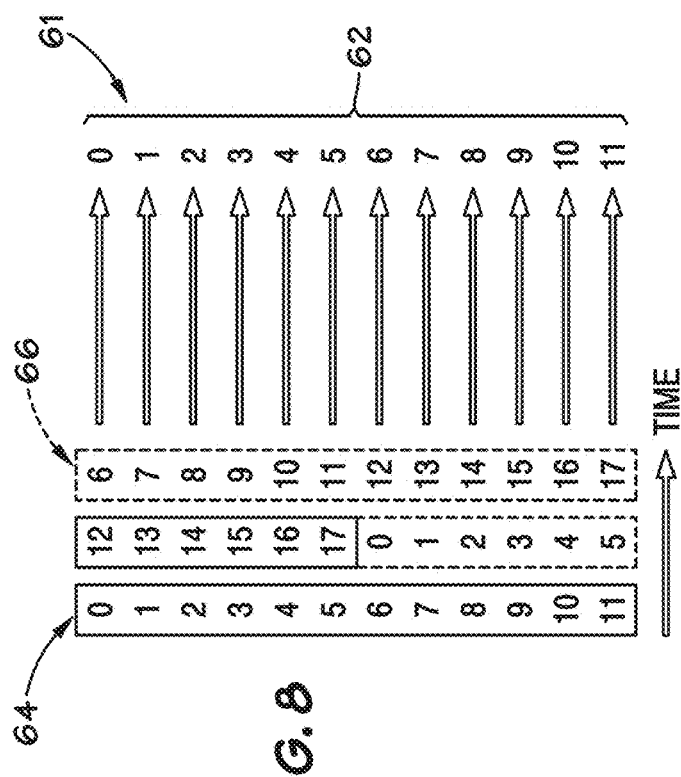
FIG. 8 illustrates a lane packing example in which a scalable protocol packs two 18-bit requests together, in accordance with an embodiment.

In one embodiment, instead of padding the data being transmitted, the scalable protocol may allow requests to be packed together. The bus signal is thus left without padded zeros. For example, FIG. 8 illustrates a lane packing example 61 in which the scalable protocol packs two 18-bit requests together. Referring to FIG. 8 the scalable protocol may regard transmissions as symbols instead of bits. In the example of FIG. 8, one bit may represent one symbol. Since the bus 62 in FIG. 8 includes 12 lanes (i.e. may transmit 12 bits in one flit), the scalable protocol may transmit the two 18-bit requests by packing the requests together. That is, a second 18-bit request 66 may be transmitted immediately after a first 18-bit request 64. As such, the transmission bus includes no wasted bits (e.g., padded zeros).

In certain embodiments, to ensure that the receiving component can identify the start of a new packet in the packed lane, the transmitting component may start each new packet 30 with a start bit, which may be specified in the start bit field 46, as mentioned above. As such, when the receiving component receives the packed data packets as a stream of bits, it may identify the start of each packet based on when the start bit is detected. With this in mind, each packet that is transmitted may include a start bit (e.g., value of 1) to indicate the presence of a new packet. In this way, when a receiving component receives the packets packed together, it may identify the beginning of each new packet, determine the transaction type of the packet based on the transaction type field 32, the transaction window based on the transaction window field 42, the address for the operation based on the address field 44, the number of levels of indirection based on the level of indirection field 48, and the error checking code based on the ECC field 36.

Figure 9:
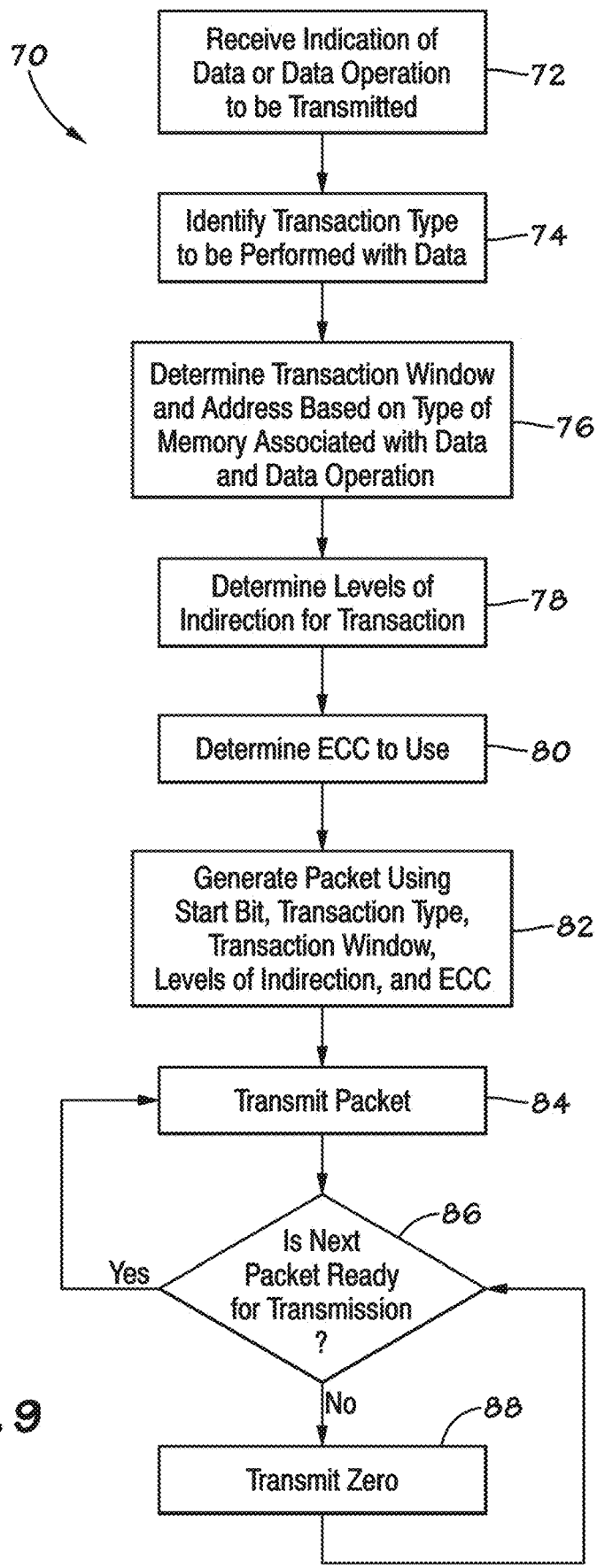
FIG. 9 illustrates a flow chart of a method for generating a packet for transmission, in accordance with an embodiment.

With this in mind, FIG. 9 illustrates a flow chart of a method 70 for generating a packet for transmission, such that the packet can be transmitted using the lane-packing scheme described above. For the purposes of discussion, the following description of the method 70 will be discussed as being performed by the memory SoC 22 (i.e., transmitting/requesting component), but it should be understood that any processor that is part of the memory device 14 may perform the operations described in the method 70.

Referring now to FIG. 9, at block 72, the memory SoC 22 may receive an indication of a data operation to be transmitted. The data operation may include a message to be sent, a read operation, a write operation, or the like. At block 74, the memory SoC 22 may identify a transaction type that corresponds to the data operation. In certain embodiments, the software requesting that the data operation be performed may specify the transaction type. Alternatively, the memory SoC 22 may receive a command from the software and determine the corresponding transaction type from a look-up table or a storage unit locally accessible by the memory SoC 22. That is, the memory SoC 22 may consult a look-up table that may include a number of transaction types indexed according to a number of possible data operations that may be requested.

At block 76, the memory SoC 22 may determine a transaction window based on the memory type associated with the requested data operation. That is, the memory SoC 22 may determine what type of memory will be accessed when performing the data operation and determine a corresponding transaction window based on the type of memory using a look-up table or the like. In addition to the transaction window, the memory SoC 22 may determine a memory address that refers to a location of data related to the data operation and the transaction window. For example, for a read operation, the address may refer to the location of the data that is to be read from a specified memory.

At block 78, the memory SoC 22 may determine a number of levels of indirection that corresponds to the requested data operation. As discussed above, the number of levels of indirection may be specified by the data operation itself or by the software requesting that the data operation be performed.

At block 80, the memory SoC 22 may generate an error control code (ECC) value for the packet 30. The ECC value may be used by the receiving component to ensure that the packet 30 is received without error. As such, the memory SoC 22 may first determine an appropriate error control code (ECC) algorithm to use to encode the packet 30. In one embodiment, the software application requesting the transmission may specify the ECC to algorithm use. Alternatively, the host SoC 12 or the memory SoC 22 may specify a particular ECC algorithm to use to encode and decode all of the transmitted and received packets. In any case, the ECC value for the packet 30 may be determined based on the bits provided in the transaction type field 32 and the payload field 34.

After determining bit values that represent the transaction type, the transaction window, the number of levels of indirection, and the ECC value mentioned above, the memory SoC 22 may, at block 82, generate the packet 30 according to the values determined at blocks 72, 74, 76, and 80. When generating the packet 30, the memory SoC 22 may initially provide a 1 for the start bit field 46 to indicate to a receiving component that a new packet is being transmitted. After inserting the 1 in the start bit field 46, the memory SoC 22 may provide a value that represents the transaction type identified at 74 in the transaction type field 32.

The memory SoC 22 may then generate the payload field 34 of the packet 30 using the transaction window and address determined at block 76 and the number of levels of indirection determined at block 78. That is, the memory SoC 22 may enter the transaction window value after the transaction type field 32 and into the transaction window field 42. The memory SoC 22 may then enter the address for the data operation into the address field 44 and the number of levels of indirection into the level of indirection field 48.

After the packet 30 is generated, the memory SoC 22 may, at block 84, transmit the packet 30 via the channels 16, the channels 29, or the like depending on the destination of the packet 30. After the generated packet 30 is transmitted, the memory SoC 22 may proceed to block 86 and determine whether the next packet to be transmitted is ready for transmission. Generally, the next packet for transmission may be generated according to the process described above with regard to blocks 72-82. If the next packet is ready for transmission, the memory SoC 22 may proceed to block 84 again and transmit the next packet immediately after the previous packet is transmitted. By transmitting each subsequent packet immediately after another packet is transmitted, the memory SoC 22 may transmit packets according to a packed lane scheme, which does not involve padding zeros on a bus when all of the lanes of a bus are not utilized.

Figure 10:
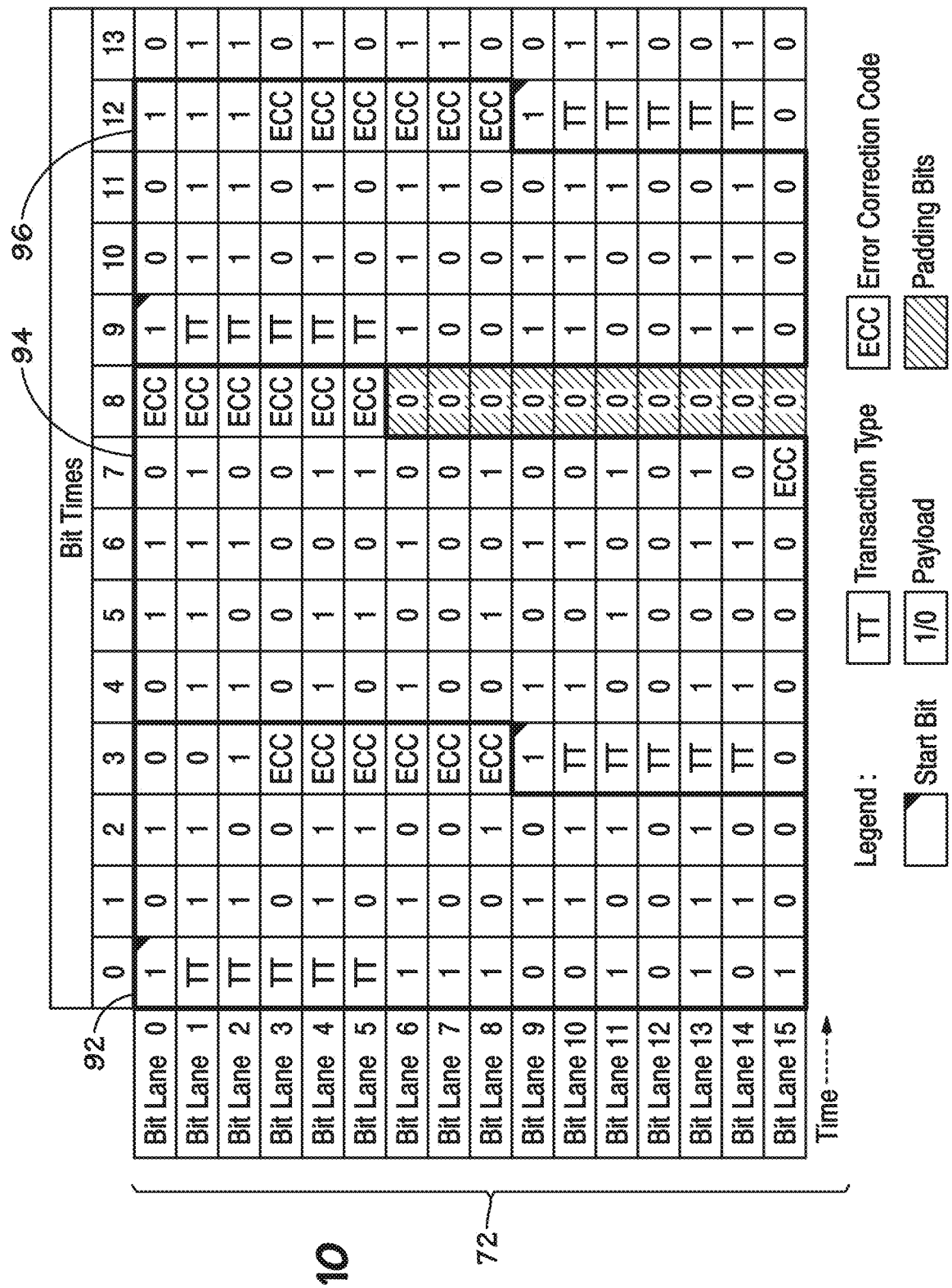
FIG. 10 illustrates a block diagram depicting a number of packets that may be transmitted according to the lane packing scheme, in accordance with an embodiment.

To better illustrate how packets may be transmitted according to the packed lane scheme, FIG. 10 illustrates a number of packets that may be transmitted according to the packed lane scheme described herein. As shown in FIG. 10, the first packet 92 being transmitted on the bus 62 includes a start bit (1), 5 bits for the transaction type field 32, 45 bits for the payload field 34, and 6 bits for the ECC field 36. Immediately after the first packet 92 is transmitted, the second packet 94 is transmitted on the bus 62. As such, in bit lane 9 at bit time 3, immediately after the last bit of the ECC field 36 of the first packet 92, a start bit (1) is present. Moreover, the remaining bit lanes (i.e., bit lanes 10-15) include data associated with the second packet 94.

In contrast to other packet transmission schemes, none of the bit lanes of the bus 62 are padded with zeros or not utilized for the transmission of a packet. That is, in other packet transmission schemes, since the first packet 92 occupied just 9 bit lanes of the available 16, the remaining bit lanes (i.e., bit lanes 10-15) would be padded with zeros and the second packet 94 would be transmitted beginning at bit time 4. In this way, the memory SoC 22 may maximize the efficiency of the bus utilized for sending packets.

It should be noted that there are still instances when the memory SoC 22 may still transmit zeros between sending packets. For instance, referring back to block 86 of FIG. 9, if the next packet is not ready for transmission, the memory SoC 22 may proceed to block 88 and transmit a zero in the next available bit lane. That is, since the bus 62 operates continuously, the memory SoC 22 may not be able to stall the bus 62 and thus may transmit zeros on the bus 62 until the next packet is ready for transmission. As such, after the memory SoC 22 transmits a zero along the bus in the next available bit lane, the memory SoC 22 may return to block 86 and again determine whether a next packet is ready for transmission. This scenario is also illustrated in FIG. 10.

Referring again to FIG. 10, after the second packet 94 is transmitted, the memory SoC 22 may not have another packet ready for transmission. As such, at bit time 8, the memory SoC 22 may begin transmitting zeros until the third packet 96 is ready for transmission. As such, the memory SoC 22 may transmit zeros on bit lanes 6-15 at bit time 8 until the third packet 96 is ready for transmission at bit time 9. To ensure that the receiving component may not misinterpret the zeros padded in the bus as data, the receiving component may continuously receive the bits from the memory SoC 22 and determine that a valid packet is being transmitted after receiving a one or the start bit of the next packet.

In certain embodiments, if another packet is not ready for transmission, the memory SoC 22 may power down the bus 62 until the next packet is ready for transmission. In this case, the memory SoC 22 may conserve energy used to power the bus 62 when the bus 62 is not being utilized to transmit packets.

To illustrate the efficiency in transmitting packets using the lane-packing scheme, the following example is presented. A transmission sequence on a 10-lane bus may include the following bus activity: 73 bits, then 652 bits, then 73 bits, then 652 bits. This group of 4 requests includes a total of 1450 bits, which includes exactly 145 signal intervals (formally called Unit Intervals or UI) on the bus with no wasted bits. A UI may refer to one clocked group of data including a certain number of bits. For instance, on an 8-bit bus or an 8-lane link, one flit of data transmitted via the 8-lane link may correspond to one flit. The one flit may then be referred to as one UI including 8 bits of data. As such, the UI may be used to evaluate an efficiency in which a bus is being utilized. That is, the UI occupancy of a packet is calculated by dividing the packet bit counts (including StartBit, transaction type field 32, payload field 34, and ECC field 36) by the bus width of 8b. As such, if the 8-lane link is used to send 6 bits of data, the UI is 0.75 (6/8).

Keeping the foregoing in mind, the example presented below assumes the following conditions are present: a ECC Hamming Distance 3, the transaction type field 32 includes 5 bits on both the request bus Q and the response bus S, the dataSequenceNumber is 7 bits, a 8-bit unit size, a 4-bit transactionSize, a 3-bit Window, a 48-bit address, 2-bit levelsOfIndirection, a 24-bit RMWopcode+data, a 4-bit messageType. With these sizing assumptions, 11 sample transaction types, which may appear on the response bus S, may include packet sizes of 79b, 83b, 144b, 273b, 401b, 530b, 658b, 786b, 914b, 1043b and 2067b. These packet sizes include the transaction type field 32, the payload field 34, and the ECC field 36, but excludes the StartBit mentioned above. In a conventional 8b bus, zero paddings would be added to bring each packet up to an even 8b boundary, and no StartBit would be required. As such, the number of bus flits, or the number of Unit Intervals, used to transmit these 11 transaction types after adding the zero padding will respectively be 10 (79/8), 11 (83/8), 18 (144/8), 35 (273/8), 51 (401/8), 67 (530/8), 83 (658/8), 99 (786/8), 115 (914/8), 131 (1043/8), and 259 (2067/8). That is, for the first packet of 79 bits, one zero will be padded onto the last 8 bits of the packet, such that 10 8-lane links will be employed to send the 79-bit packet.

However, using the techniques described herein, such as adding the StartBit and packing the responses together, the number of UIs used to transmit the same packets is respectively 10 (80/8), 10.5 (84/8), 18.125 (145/8), 34.25 (274/8), 50.25 (402/8), 66.375 (531/8), 82.375 (659/8), 98.375 (787/8), 114.375 (915/8), 130.5 (1044/8), and 258.5 (2068/8). As such, the average savings for randomly selected packet sizes is 0.5 UI per transaction, hence the bit savings grows as the number of lanes is increased. This example is indicative of any width of the request bus Q or the response bus S, whether they are equal or unequal widths on the two buses. To enable the scalable protocol to pack the lanes as described above, the host SoC 12 or any other receiver may use the following transmission/receiving scheme: receive the packet 30, parse contents of the packet 30 to identify the transaction type, size of the payload, and a location of the ECC field 36 within the packet 30, verify a correctness of the packet 30 based on the ECC, and then act upon the transmission with certitude.

In this manner, a received transmission packet may be captured in its entirety into a receiver buffer (e.g., the buffer 23) before its contents are parsed. Moreover, the receiver may not use the received packet unless the packet is verified as error-free. The buffer 23 may be operated as a first-in-first-out (FIFO) with an added ability for selective flushing in the event that a transmission error is detected. The scalable protocol may include a variable bit length ability for pulling data out of the buffer 23 and for packet bit shifting. As discussed above with reference to FIG. 3, the beginning of the packet 30 may include the transaction type field 32, which may specify a packet size based on the transaction type indicated in the transaction type field 32. As such, the transaction type field 32 includes information that the scalable protocol may use to determine a packet size including the size and relative location of the ECC field 36 within the packet 30. After the ECC is checked, the receiver employing the scalable protocol may determine whether the packet 30 is error-free. If the packet is deemed error-free, then the receiver may know that the transaction type was properly decoded and that the packet size was interpreted correctly. The receiver may then proceed onward to the next packet received immediately after the recently parsed packet. This scalable protocol may be used with any bus variations, whether full or half duplex, regardless of sizes, lengths, encoding/decoding methods, and the like. Additional details of a process that occurs after the receiving component receives the packets packed according to the lane packing scheme will be discussed with reference to FIG. 11 below.

For reference, the scalable protocol may include transmissions that vary in length. That is, on the request bus Q, the scalable protocol may use 16 different lengths. For example, the request bus may include length bit counts of 43, 73, 97, 135, 143, 149, 200, 201, 216, 330, 362, 588, 652, 1054, 1105, and 1230 with no padding to create any particular optimized length, such as all being increments of 8 or such. In the same manner, the response bus S may include 8 different lengths, such as length bit counts of 33, 42, 85, 101, 167, 297, 555, and 1069, again with no padding.

Parsing Packets for Data Packing

As mentioned above, the scalable protocol may be designed to facilitate a maximum bit efficiency. As such, in certain embodiments, the packet 30 may have an arbitrary size that does not correspond to an integer multiple of the utilized physical bus. The transmission of arbitrarily sized packets maintains bit efficiency by packing the packets tightly together, such that each succeeding packet is transmitted immediately after the preceding packet without padding either packet with zeros. However, for the receiver (e.g., host SoC 12) to determine where the first packet ends and the second packet begins, the receiver may implement certain techniques described herein for parsing the received packets. In certain embodiments, the scalable protocol may specify a parsing method for the receiver to employ on received packets. This parsing method may include shift operations, error detection, and buffer management as pipelined operations at the head of the logical operations utilized in a system implementation.

Keeping the foregoing in mind, an example of a physical bus of 8 bits unidirectional in the ingress directions and 8 bits in the egress directions, full duplex, is described below to clarify certain aspects of the parsing method. In this example, one flit is considered to be one unit interval of data being present on a bus. That is, one flit may include 8 bits of data being transferred via the bus. Moreover, the smallest packet with Address 36b, Window 3b, and Hamming Density (HD6) error coverage of 59 bits may include a 5-bit Transaction Type, a 41-bit data payload, and a 13-bit ECC. Assuming that an endless stream of similarly sized small packets may be packed together, leaving no bit gaps, the transmission may reflect the following sequence, starting from lane 0 and going to lane 7 for a first packet being transmitted: (name.0 means bit 0 of that field)

| flit 1 | TT.0  | TT.1   | TT.2   | TT.3 | TT.4 | D.0   | D.1   | D.2   |
|--------|-------|--------|--------|------|------|-------|-------|-------|
| flit 2 | D.3   | D.4    | D.5    | D.6  | D.7  | D.8   | D.9   | D.10  |
| flit 3 | D.11  | D.12   | D.13   | D.14 | D.15 | D.16  | D.17  | D.18  |
| flit 4 | D.19  | D.20   | D.21   | D.22 | D.23 | D.24  | D.25  | D.26  |
| flit 5 | D.27  | D.28   | D.29   | D.30 | D.31 | D.32  | D.33  | D.34  |
| flit 6 | D.35  | D.36   | D.37   | D.38 | D.39 | D.40  | ECC.0 | ECC.1 |
| flit 7 | ECC.2 | ECC.3  | ECC.4  | ECC.5| ECC.6| ECC.7 | ECC.8 | ECC.9 |
| flit 8 | ECC.10| ECC.11 | ECC.12 |      |      |       |       |       |

The second packet may then be set starting with flit 8, lane 3, as follows:

| flit 9  |       |        |       | TT.0   | TT.1   | TT.2   | TT.3  | TT.4  |
|---------|-------|--------|-------|--------|--------|--------|-------|-------|
| flit 10 | D.0   | D.1    | D.2   | D.3    | D.4    | D.5    | D.6   | D.7   |
| flit 11 | D.8   | D.9    | D.10  | D.11   | D.12   | D.13   | D.14  | D.15  |
| flit 12 | D.16  | D.17   | D.18  | D.19   | D.20   | D.21   | D.22  | D.23  |
| flit 13 | D.24  | D.25   | D.26  | D.27   | D.28   | D.29   | D.30  | D.31  |
| flit 14 | D.32  | D.33   | D.34  | D.35   | D.36   | D.37   | D.38  | D.39  |
| flit 15 | D.40  | ECC.0  | ECC.1 | ECC.2  | ECC.3  | ECC.4  | ECC.5 | ECC.6 |
| flit 16 | ECC.7 | ECC.8  | ECC.9 | ECC.10 | ECC.11 | ECC.12 |       |       |

The third packet may then start in flit 16, lane 6, as follows:

| flit 16 |       |       |       |       |       |       | TT.0   | TT.1   |
|---------|-------|-------|-------|-------|-------|-------|--------|--------|
| flit 17 | TT.2  | TT.3  | TT.4  | D.0   | D.1   | D.2   | D.3    | D.4    |
| flit 18 | D.5   | D.6   | D.7   | D.8   | D.9   | D.10  | D.11   | D.12   |
| flit 19 | D.13  | D.14  | D.15  | D.16  | D.17  | D.18  | D.19   | D.20   |
| flit 20 | D.21  | D.22  | D.23  | D.24  | D.25  | D.26  | D.27   | D.28   |
| flit 21 | D.29  | D.30  | D.31  | D.32  | D.33  | D.34  | D.35   | D.36   |
| flit 22 | D.37  | D.38  | D.39  | D.40  | ECC.0 | ECC.1 | ECC.2  | ECC.3  |
| flit 23 | ECC.4 | ECC.5 | ECC.6 | ECC.7 | ECC.8 | ECC.9 | ECC.10 | ECC.11 |
| flit 24 | ECC.12|       |       |       |       |       |        |        |

Keeping the three example packets illustrated above in mind, incoming bits may be placed into a receive FIFO once received by the receiver. Since in the above example there are 8 lanes, the bits may be moved 8 at a time. However, since the incoming bus may be extremely fast (e.g., too fast to cycle the FIFO), the FIFO may also be made to be considerably wider and the data may be sent to each successive 8b width of FIFO in succession until reaching the last unit of width. At that time, the FIFO address is incremented in accordance with usual FIFO operations and the fill begins again at FIFO lanes 0-7, then 8-15, etc. until the last unit of width is received again. This allows slower logic to keep up with very fast serializer/deserializer (SERDES) components (e.g., 40 Gb/s SERDES has a unit interval of 25 ps). If a logical clock of 2 GHz is used, the FIFO may be 20× the 8-bit lane width or 160 bits wide. As such, the ECC logic could naturally be built in 160-bit blocks using XOR gates for each block (e.g., block 0 processes bits 0 through 159, block 1 processes bits 160 through 319, etc., such that the total number of ECC blocks may be 14, where each ECC block may include a different interconnection of 2-input XOR gates).

Since each of the three packets described above are transmitted successively, and since the arrival of bits to a receiver does not include any framing information, it is the responsibility of the receiving circuitry (e.g., host SoC 12) to first determine the length of the packet so that the packet can be properly framed. Referring again to the example above, the receiver may first receive the 160-bit value immediately available from the FIFO. In the particular example described above, the entire first packet resides within that 160-bit zone.

As mentioned above, the first part of the packet 30 may include the start bit field 46 indicating the beginning of the packet 30. The next part of the packet 30 may include the transaction type field 32, which may include a value of 0 through 31. The value of the transaction type field 32 may be used to index a table that indicates a size of the data payload and the size of the ECC (in bits). In certain embodiments, the receiver may use a simple logic function for the same purpose. Although it is not known immediately that all of the received bits are error free, the receiver may initially assume that they are to use the transaction type specified in the transaction type field 32. The receiver may then, in a pipeline stage, check the ECC to determine whether the received packet is error free. In one embodiment, to check the ECC, the transaction type of the transaction type field 32 and the data payload of the payload field 34 may be examined in the ECC block(s), such that the incoming ECC bits are provided to all ECC blocks. In one embodiment, the ECC block may check the ECC using a scalable error control code algorithm that employs a Hamming Distance algorithm, for example. For example, the ECC block may employ an error control code algorithm having a Hamming Distance of 6 (HD6). As such, the ECC block may provide an error coverage of 59 bits (5b TransactionType, 41b data payload, 13b ECC). That is, the ECC block may provide 59 known-to-be-correct bits. Additional details regarding the scalable error control algorithm and algorithms using a Hamming Distance will be described in greater detail below.

After the receiver verifies that the packet is error-free, the receiver may then know with certainty that the transaction type value was correct and hence the receiver may have the proper framing of the received packet. The 59 known-to-be-correct bits may then be forwarded to the next pipeline stage for further packet processing (i.e., determine the exact request being made and process the request.) After determining that the 59-bit first packet is correct and after forwarding the 59-bit first packet for further processing, the receiver may then barrel-shift the remaining 101 bits of the 160-bit wide FIFO to align to bit 0 and repeat the above process.

In some circumstances, the receiver may have too little data available to parse (i.e., everything from transaction type field 32, through payload field 34, and ECC field 36 should be available). Here, the receiver may continue fetching information until it is all available. Although large packets may exceed a single 160-bit section, since the receiver knows where ECC starts and ends from the transaction type, the receiver may forward the ECC bits to the appropriate ECC logical blocks. Moreover, since the transaction type is at the head of the packet, the receiver easily knows to look for it. Further, the receiver may determine that the payload field 34 includes everything between the transaction type field 32 and the ECC field 36. Upon identifying the payload field 34, the receiver may send the data payload to appropriate ECC logical blocks. In certain embodiments, instead of a physical MOVE, the ECC logic may be implemented in situ at register bits that temporarily store the data, depending on physical layout optimization uses.

An advantage of the above-described technique includes supporting fast generation of an error message. As such, if the ECC detects an error, a logic signal is passed on to an egress queue manager and an error message is formulated and transmitted on the appropriate channel.

Figure 11:
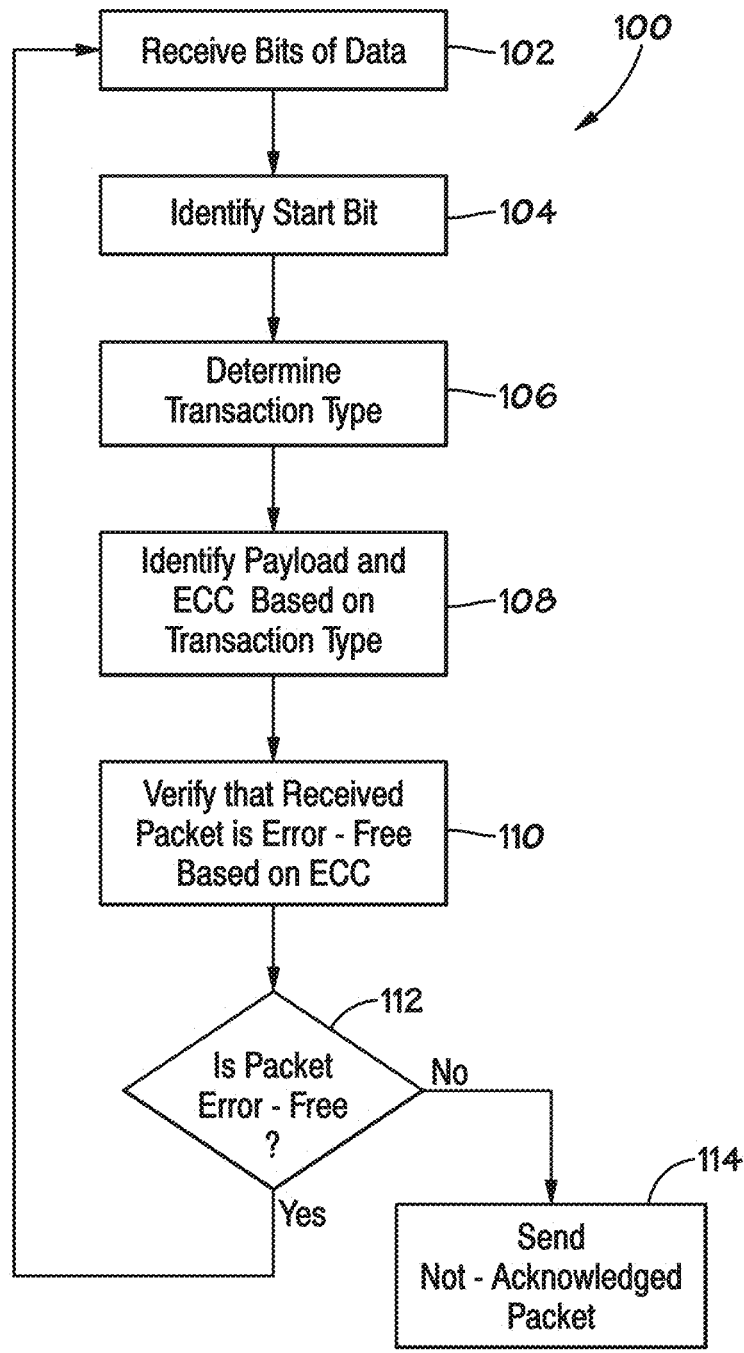
FIG. 11 illustrates a flow chart of a method for receiving packets according to the lane packing scheme, in accordance with an embodiment.

With the foregoing in mind, FIG. 11 illustrates a flow chart of a method 100 that may be employed by a receiving component (e.g., host SoC 12) that receives packets according to the lane-packing scheme mentioned above. Although the following description of the method 100 is described as being performed by the host SoC 12, it should be noted that the method 100 may be performed by any suitable receiving component that receives packets that have been lane packed according to the embodiments described herein.

Referring now to FIG. 11, at block 102, the host SoC 12 may receive a stream of bits via the bus 62, the channels 16, or the like. As depicted in FIG. 10, the host SoC 12 may receive a number of bits at a time based on the number of bit lanes available on the bus 62.

Upon receiving the stream of bits, at block 104, the host SoC 12 may identify a start bit of a new packet. As such, the host SoC 12 may monitor the stream of bits until it receives a 1. For example, at bit time 0, the host SoC 12 may detect the start bit and begin parsing the first packet 92.

At block 106, the host SoC 12 may determine the transaction type of the first packet 92 based on the five bits following the start bit. As discussed above, the host SoC 12 may use a look-up table or consult a key stored in a local storage component to determine the transaction type associated with the first packet 92 based on the binary value received in the transaction type field 32.

After determining the corresponding transaction type for a respective packet, at block 108, the host SoC 12 may identify the payload field 34 and the ECC field 36 of the respective packet. That is, the transaction type of the respective packet may indicate to the host SoC 12 a number of bits to expect in the payload field 34 and the ECC field 36. As such, the host SoC 12 may designate a first number of bits after transaction type field 32 to be the payload field 34 and a second number of bits after the payload field 34 to be the ECC field 36.

After receiving the ECC field 36 for a packet, the host SoC 12 may, at block 110, verify whether the received packet is free of errors based on the data provided in the ECC field 36. That is, the host SoC 12 may use the data provided in the ECC field 36 to check the accuracy of the data provided in the transaction type field 32 and the data provided in the payload field 34.

At block 112, the host SoC 12 may determine whether the respective packet is free of errors. If the host SoC 12 verifies that the respective packet is error free, the host SoC 12 returns to block 102 and continues receiving the stream of bits. However, if the host SoC 12 determines that the respective packet is not error free, the host SoC 12 may proceed to block 114 and send a NOT_ACKNOWLEDGE packet back to the component that transmitted the respective packet. As discussed above, the NOT_ACKNOWLEDGE packet may indicate a most recent known-to-be-good bus transaction. As such, the NOT_ACKNOWLEDGE packet may indicate the transaction type and the address of the last successfully received packet. Since the transmitting component knows the order in which each packet was transmitted, the transmitting packet may then resend the packet immediately following the packet referenced in the NOT_ACKNOWLEDGE packet.

To ensure that the transmitter component is able to resend a certain number of packets upon receiving the NOT_ACKNOWLEDGE packet, in certain embodiments, the transmitting component may not disregard, delete, erase, or write over sent packets from its buffer until a certain amount of time has passed after a respective packet has been transmitted. In other words, after a packet has been transmitted, the transmitting component (e.g., memory SoC 22) may wait a certain amount of time before it deletes the transmitted packet from its buffer component.

The amount of time that the transmitting component may wait after transmitting each packet before deleting it from its buffer may vary from packet to packet. Since each packet may include a different number of bits, the amount of time involved for transmitting the packet and receiving a NOT_ACKNOWLEDGE packet in response may be different for each packet. Generally, the amount of time that the transmitting component may wait may depend on a worst-case lag time for the packet to be transmitted across the bus 62, the worst-case lag time for the receiving component to detect the error on the packet, and the worst-case lag time for the transmitting component to receive the NOT ACKNOWLEDGMENT packet. The worst-case lag time for each situation mentioned above may be determined based on an expected time for the operation to be performed and by adding some percentage of the expected time to the expected time to provide for a margin of error in the expected time calculation.

Some of the factors involved in determining the expected time for the various operations described above to be performed include the size of the packet being transmitted, the number of lanes on the request bus Q and the response bus S, an amount of time for a UI of data to be transmitted across each bus, a number of pipeline delays that are expected in the receiving component before the receiving component verifies that the received packet is error free, a maximum depth of queues in the transmitting component, information related to a policy of the transmitting component for sending urgent messages (e.g., are urgent messages placed in the front of the queue), and the like. It should be noted that the factors listed above are provided as examples and do not limit the scope of the factors that may be used to determine the expected time for the various operations to be performed.

Data Reordering Operations

Although the transaction windows may be used to indicate an order for a given transaction window, in some instances, performing the transaction operations according to the order of the respective transaction windows may be undesirable. For example, a DRAM might involve a refresh operation, which cannot be postponed by other DRAM operations. Another example may include when a NAND memory may be shuffling data to prepare for an erase operation. Here, a range of addresses associated with the data being shuffled may be temporarily unavailable if a transaction operation is trying to access the same range of addresses. As such, it may be beneficial for the scalable protocol to reorder the operations despite a specified order according to the transaction windows.

In conventional systems, various techniques are used to allow ordering. For instance, the system may send a transaction identification with a request operation. The response operation may then include the same transaction identification. The transaction identification may be 8 bits, which means that an additional 8 bits is sent with every request and again with every response. As such, the overhead bits on both the request bus Q and the response bus S may be relatively large as compared to not sending the transaction identification with every request and response.

Keeping the foregoing in mind, in certain embodiments, the scalable protocol may preserve the order specified according to the transaction windows unless it is determined that the transaction operations may be performed more efficiently if reordered. Once the scalable protocol (e.g., receiving component) makes this determination, it may send a reorder message that may give a new relative order to a particular transaction zone. The transaction zone may include a subset of all of the transaction operations being sent. Upon receiving the reorder message, the transmitting component may reorder the transaction operations according to a new relative order provided by the reorder message. The new relative order may indicate an order in which each transaction operation may be performed with respect to other transaction operations being performed. The respective transaction zone that includes the reordered transaction operations may then maintain the new order until otherwise reordered.

As mentioned above, the receiving component may send a data reorder message when it is desirable to depart from the natural response sequence. In one embodiment, the receiving component may determine that reordering may be preferred based on the transaction type indicated in the transaction type field 32. That is, the transaction type field 32 may inherently indicate that a reordering is preferred. Accompanying the transaction type field 32 may be a 64 bit message that includes 16×4-bit order identifiers. These identifiers may indicate the order of the next 16 responses, if there are 16 responses pending.

When operating under a normal flow, the receiving component may transmit responses in order of the commands according to a given transaction window. When the receiving component determines that reordering the received requests may be preferred, the receiving component may wait until all of the responses, which can remain in order, are first sent before sending a reorder message. If the system was expecting the next group of responses in the sequence 0, 1, 2, 3, 4, 5, 6, 7, 8, 9, 10, 11, 12, 13, 14, and 15, the reorder message may alter anything within that sequence. For example, a new order of 1, 2, 3, 4, 5, 6, 7, 0, 8, 9, 10, 11, 12, 13, 14, and 15 may be preferred, such that each value is represented with a respective 4-bit value. If there are fewer than 16 responses pending, the non-existent future responses may be listed in order. That is, referring again to the example above, if 0 through 7 were pending and response 0 was preferred to be delayed until after all of the others, then the order of bits 8 through 15 may remain at the end so long as 0 was provided after all of the others.

In one embodiment, the reorder message may be sent any time that a new ordering is preferred. Referring again to the example above, if responses are sent in the order 1, 2, 3, 4, 5, 6, 7, and 0 and then it is determined that the remaining items cannot be sent in the anticipated order, a new reorder message may be sent. Here, the very next response would be response 0, not response 8, because an order counter is reset to zero any time a reorder message is sent. As such, upon sending the new reorder message, the new relative order of 0 through 15 may be determined according to the most advantageous ordering. In the absence of any reorder messages, all data may be in a "natural" order of the requests received per window. In any case, by supporting data reordering in the system without routinely transmitting request identifications or response identifications, the scalable protocol may save a large amount of overhead that is otherwise used in conventional protocols.

Figure 12:
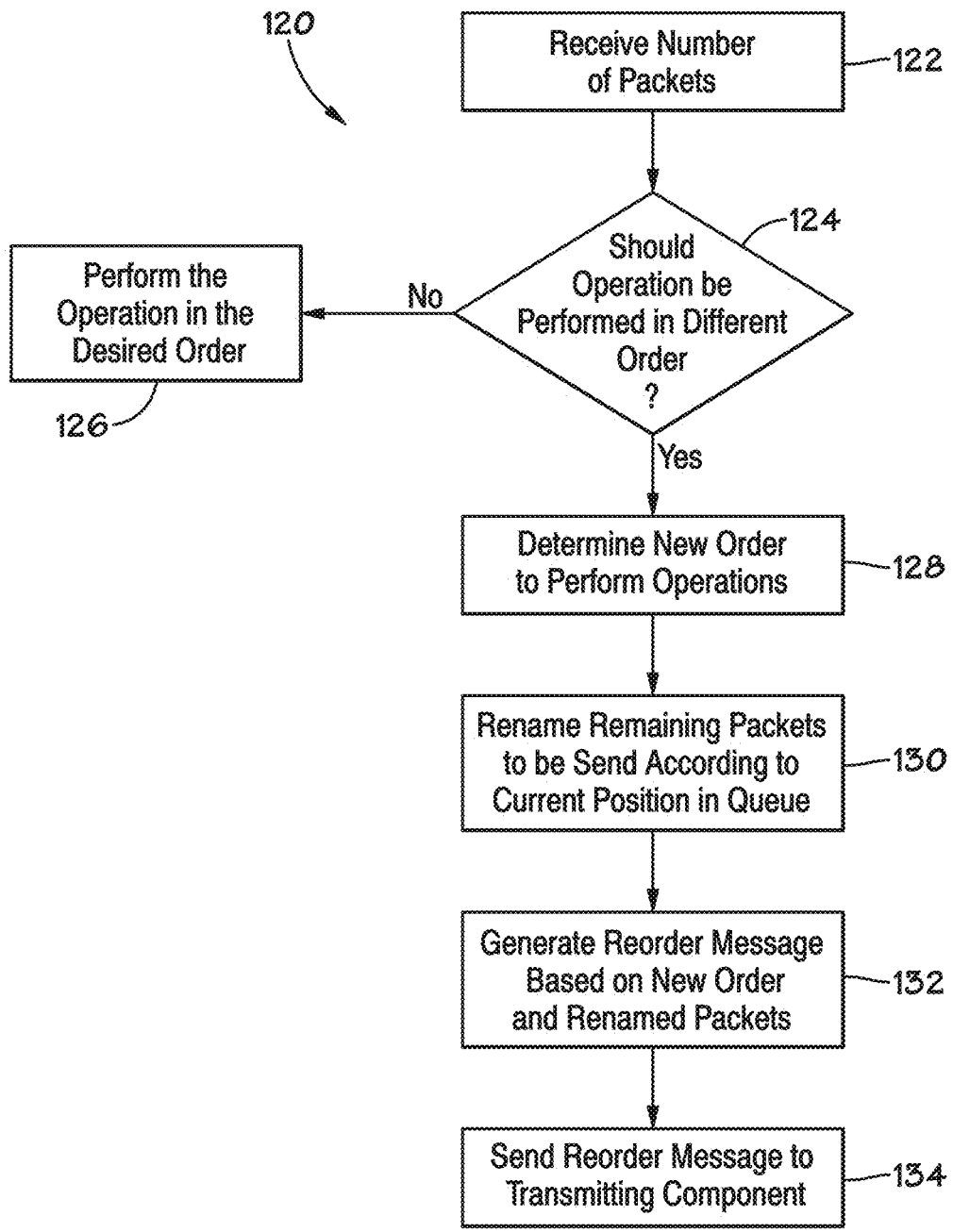
FIG. 12 illustrates a flow chart of a method for reordering operations that are performed by a component receiving packets, in accordance with an embodiment.

With the foregoing in mind, FIG. 12 illustrates a flow chart of a method 120 that may be employed by the receiving component (e.g., host SoC 12) for reordering packets to be transmitted to the receiving component as compared to an original order in which the packets are intended to be transmitted by the transmitting component (e.g., memory SoC 22). The following description of the method 120 will be discussed with reference to a diagram 140 of FIG. 13. The diagram 140 is provided to help illustrate the operations that occur at various stages of the method 120. For the purposes of discussion, the following description of the method 120 will be described as being performed by the host SoC 12, but it should be understood that any suitable receiving component may perform the operations described herein.

Referring first to FIG. 12, at block 122, the host SoC 12 may receive a number of packets from the transmitting component (e.g., memory SoC 22). The received packets may generally include operations requested to be performed by the host SoC 12 in a preferred order. The transmitting component (e.g., memory SoC 22) may send packets that correspond to data operations in a particular order, which may reflect a preferred order of operations. The diagram 140 of FIG. 13 illustrates an example original order of packets received by the host SoC 12 in row 142. As shown in FIG. 13, ten packets transmitted by the transmitting component may be initially numbered 1-10.

At block 124, the host SoC 12 may determine whether the operations indicated in the received packets should be performed in a different order. That is, for example, if the host SoC 12 is unable to perform a particular operation for some reason (e.g., requested memory address is busy, unavailable, etc.), the host SoC 12 may instead perform a later operation before performing the previously requested operation. If the host SoC 12 determines that the operations should not be performed in a different order, the host SoC 12 may proceed to block 126 and perform the operations of the received packets in the preferred order (e.g., as transmitted by the transmitting component).

If the host SoC 12 determines that the operations should not be performed in the preferred order, at block 128, the host SoC 22 may determine a new order to perform the requested operations. To perform operations in a different order, the host SoC 12 may identify a particular packet that corresponds to an operation that may not be performed in the requested order. The host SoC 12 may then determine whether any subsequent operation is dependent on the results of the identified operation. That is, the host SoC 12 may determine whether performing the identified operation at a later time may cause an error in any remaining operations to be performed. In certain embodiments, the host SoC 12 may evaluate the transaction windows of each packet to determine whether operations may be reordered. For instance, if an order of have the transaction windows is as follows: Win2, Win2, Win2, Win3, Win3, Win2, and Win3, the host SoC 12 may delay the third Win2 request to perform the first Win3 request because they refer to different transaction windows and thus likely operate on different memory types. Using the transaction windows of each packet, the host SoC 12 may then determine a new order to perform the requested operations.

After determining the new order to perform the operations, at block 130, the host SoC 12 may rename a number of packets that are received after a packet immediately preceding the packet that corresponds with the identified operation. In one embodiment, the host SoC 12 may rename the packets according to their current position in the queue. For instance, referring again to FIG. 13, if the host SoC 12 identifies original packet 5 as a packet containing an operation that should be performed at a later time, the host SoC 12 may rename the packets after packet 4 according to their current position in the queue. As such, packets 5-10 may be renamed to packets 0-5 as illustrated in row 144 of the diagram 140. In this manner, the remaining packets may be renamed according to their relative position in the queue.

After renaming the remaining packets, at block 132, the host SoC 12 may generate a reorder message that indicates a new order in which the remaining packets will be addressed by the host SoC 12 or according to the order of corresponding operations that will be performed by the host SoC 12. The reorder message may be determined based on the new order determined at block 128 and according to the renamed packets, as provided in block 130. For instance, referring to the example in FIG. 13 again, if the host SoC 12 determined that the original $5^{th}$ packet operation should be performed after the original $7^{th}$ packet operation, the reorder message may be presented as 1, 2, 3, 0, 4, 5, as shown in row 146. Row 146 indicates the new order of operation according to the renamed packets. For illustrative purposes, row 148 indicates the order in which the reorder message specifies that the remaining packet operations will be according to their original packet numbers.

At block 134, the host SoC 12 may transmit the reorder message to the transmitting component. As such, the transmitting component may use the reorder message to adjust the order in which the response packets transmitted from the host SoC 12 are associated with a respective request packet. That is, the transmitting component may associate each response packet received after the reorder message according to the renamed relative order indicated in the reorder message.

By renaming the packets after the packet that corresponds to the last implemented operation, the host SoC 12 may provide a reference order to the transmitting component that is relative to the remaining response packets that are to be received by the transmitting component. As such, since the host SoC 12 and the transmitting component may know the order in which packets have already been sent, the packets renamed according to their relative order enables the host SoC 12 to associate the response packets without having to send a packet identification number with each packet, thereby providing a more bit-efficient communication scheme.

In circumstances where there are multiple request and response buses, the scalable protocol may determine the order in which transaction operations are performed, as follows. If there are 4 request buses associated with 4 respective response buses, an associated pair of request and response buses may be named by the scalable protocol as a channel. As such, in one embodiment, a transaction operation may be defined as "channel.window.address." Here, the ordering may then be defined as "channel.window.dataSequenceNumber." Often times, just one datum may be part of the transaction operation, such that the data sequence number is often unimportant to save for transaction requests larger than a largest supported packet size. Otherwise, the scalable protocol may follow an ordering within the channel.window. Even when two channels are using the same window, the scalable protocol may not incorporate any ordering between them. Instead, the scalable protocol may provide an order within each channel.window combination. As a result, the scalable protocol may greatly simplify the operation of the system because channels have the possibility of asynchronous timing inter-relationships. By ordering the transaction operations according to the channel.window, the scalable protocol keeps the ordering simple and also reduces a number of times arbitration may be performed. Moreover, this ordering technique may also reduce a number of reorder messages that have otherwise been sent.

Data Reordering Operations—High Frequency

Although scalable protocol has been described as being capable of providing a new relative order for transaction operations being sent, it may be difficult to incorporate this type of reordering scheme in large systems that may have a high frequency of reordering requests. That is, if reorder messages are sent at some high frequency (i.e., above a certain threshold), it may no longer be an efficient use of time and resources to send reorder messages and reorder the transaction operations. In other words, for some types of systems the frequency of data reordering could become so high that the amount of communications between the transmitting component and the receiving component may become inefficient. For such systems, the scalable protocol may reduce bit traffic of transaction identifications even when large numbers of reorder events are preferred.

In one embodiment, the receiving component may determine whether the current reorder technique is operating inefficiently. For instance, the transmitting component may determine a frequency at which the reorder messages are being received from the receiving component. If the frequency is above some threshold, the transmitting component may determine that the current reorder scheme is operating inefficiently. At this time, the transmitting component may append each transaction identification (ID) of each transaction operation to include a new field: a request bus Q sequence number. Since the receiving component may know the order that requests are received, the receiving component may assign a round-robin sequence number to each received request (i.e., request bus Q sequence number, Qsequence or Qseq). The request bus Q sequence number may apply to the combination of the respective channel and the respective window of each request. As such, the request bus Q sequence number may be denoted as "channel.window.Qseq," such that Qseq may be assigned in round robin order for each respective channel and respective window, thereby preserving bandwidth by not transmitting known data. For instance, if an order of requests (all on channel 0)

is as follows: Win2, Win2, Win2, Win3, Win3, Win2, and Win3 and these are the first transactions, the assigned Qseq numbers appended by the receiver would be: 0, 1, 2, 0, 1, 3, and 2 respectively. That is, each window may be associated with a round robin Qseq sequence based on the receipt of each type (i.e., channel/window) of request.

After receiving the requests and when a response is planning to be sent on the response bus S, the receiving component may tag each respective response with its corresponding Qseq value. As such, the transmitting component may associate each received response with its respective request. As shown above, the technique described above avoids transmitting a Qseq value on the request bus Q. By not sending the Qseq value on the Q bus, the scalable protocol provides an additional way in which to provide bit-efficient transfer.

Figure 14:
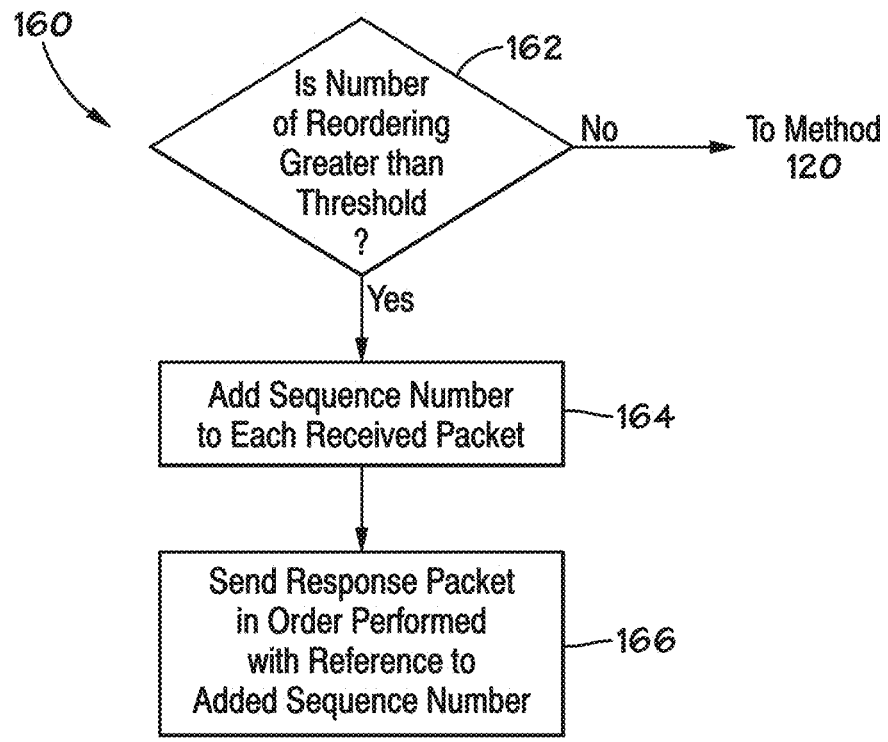
FIG. 14 illustrates a flow chart of another method for reordering operations that are performed by a component receiving packets, in accordance with an embodiment.

Keeping this in mind, FIG. 14 illustrates a method 160 for reordering operations performed by a receiving component. Again, as mentioned above with regard to the method 120, the following method 160 will be described as being performed by the host SoC 12. However, it should be understood that the following method 160 may be performed by any suitable receiving component.

Referring now to FIG. 14, at block 162, the host SoC 12 may determine whether a number of reordering messages transmitted to the transmitting component over some period of time exceeds some threshold. The threshold may be related to a declining performance of the memory device 14, an average number of cycles involved when performing an operation, an average queue depth for each requested operation, or the like.

If the number of reordering requests is not greater than the threshold, the host SoC 12 may continue sending reorder messages according to the method 120 described above. However, if the host SoC 12 determines that the number of reordering requests is greater than the threshold, the host SoC 12 may proceed to block 164. At block 164, the host SoC 12 may add a sequence value to each received packet in a round robin fashion according to the transaction window of each packet. The transmitting component may store an order in which each packet has been transmitted, such that the order of transmission may correspond to the order in which each packet was received.

At block 166, the host SoC 12 may send response packets in an order in which their respective operations have been performed. The response packets may include the sequence value added to the received packet at block 164. Since the transmitting component is aware of the order in which each packet has been sent, it may use the added sequence value to apply the response packet to the appropriate request packet. Using the method 160 to transmit response packets, the host SoC 12 and the transmitting component may add a sequence number to the packets that are transmitted once across the bus 62, as opposed to keeping the sequence number on both transmissions. In this way, the scalable protocol provides bit efficient data transfers by leveraging information known by the transmitting component, such as the order in which packets were transmitted.

In certain embodiments, in an event such as a long transaction requiring multiple packets, the receiving component may use a request bus Q sequence number (Qseq) and a data sequence number (DataSequence) to identify each packet when an error occurred and the pipeline may be flushed and the corresponding packets within the pipeline may be resent. For instance, if the error occurred in a packet on the response bus S, a last known-to-be-good packet received by the transmitting component may include a Qseq number in it to use as reference. As a result of employing this technique, some of the messages are actually now shorter since a transaction type is not referenced to indicate a transaction. That is, to otherwise indicate the transaction type, the transaction type, window, and address within a packet, up to 52 bits may be used to include this information. In contrast, sending the Qseq value and the DataSequence value may involve 23 bits (e.g., 16+7=23 bits), thereby further improving the bit efficiency in transfers.

As compared to the re-order message techniques described earlier, appending packets with a Qseq value may result in a lower overall number of bits transmitted when the number of times that a re-order is performed is above some frequency threshold. Although the option of providing a Qseq value has been described as being incorporated within the scalable protocol dynamically, in certain embodiments, the ability of the scalable protocol to provide the Qseq value may be a static choice built into the scalable protocol at the time the SoC that implements the scalable protocol is designed. The type of system using the scalable protocol may provide information to indicate which ordering method may provide more bit-efficient transfers.

Keeping the foregoing in mind, in one embodiment, the request bus Q sequence number field may be an 18-bit field that may be used to identify each transaction operation of a 4 kilobyte transaction. Although the request bus Q sequence number field has been described as an 18-bit field, the size of the request bus Q sequence number field may be any suitable value. Generally, the size of the request bus Q sequence number field may be large enough to identify each transaction operation of a particular transaction and may be used to indicate an order in which the request or response may be performed. Although the addition of the request bus Q sequence number field to a respective packet may increase a respective size of the respective packet, the increase in packet sizes is still more efficient than sending a transaction identification with every request and response operation, as performed in conventional protocols. Moreover, since the addition of the request bus Q sequence number field may be done after determining that sending reordering messages is inefficient, the present technique is limited for use in specific instances, as opposed to being used for every transaction operation as in conventional protocols.

In some embodiments, when requests have an implied sequence number (e.g., for a given channel.window, the first request is 0, next is 1, next is 2, etc.), the scalable protocol may not add a request bus Q sequence number field to the transaction operation. That is, since the transaction operations are in a natural implied order, the scalable protocol may save bits from being sent by not transmitting the sequence numbers.

However, when responses are preferred to flow in a different order other than that natural implied order, as mentioned above, the scalable protocol may append each received transaction operation with a corresponding sequence number in the request bus Q sequence number field. In some cases, the sequence number may potentially use a large bit field. For example, in a window that supports NAND, a response could require 0.01 seconds. Here, if the packet rate is $5 \times 10^{-9}$, there could be $5 \times 10^7$ responses in flight, which may use 26 bits to identify each of the responses. A more practical scenario anticipates larger transactions of approximately 4 kilobytes where there may be approximately 100,000 outstanding transactions. Here, each transaction may be identified in just under 17 bits. To allow better performance with small transactions and also to ensure there is no identification aliasing, the bit count may be rounded up to 18 bits. That is, the numbers may modulo wrap around to zero and so there may be an obvious gap in the sequence that is "alive" at any time to avoid confusion.

In any case, when providing a reordering sequence, the scalable protocol may add a request bus Q sequence number field to a corresponding packet. As such, some of the fields described above may change. For example, on the request bus Q, the not-acknowledge command may change such that it has the same transaction type and the same transaction window. Previously, the not-acknowledge command may have included an address, a data sequence number, and an original transaction type. In one embodiment, the not-acknowledge command may now have a request bus Q sequence number and a data sequence number. As a result, the not-acknowledge command may be a smaller packet than previously described.

On the response bus S, the general message transaction type may be unchanged. However, the remaining items of the packet may change as follows:
- "Complete" message may have a transaction type, a window, a request sequence number, and an ECC.
- "Not-Acknowledged" (NACK) message may have a transaction type, a window, a request sequence number, a data sequence number, and an ECC.
- "Message" may be unchanged, and thus may include a transaction type, a window, 8B data, and an ECC.
- 8uData may include a transaction type, a window, a request sequence number, and 8B data, and an ECC.
- 16uData may include a transaction type, a window, a request sequence number, and 16B data, and an ECC.
- 32uData may include a transaction type, a window, a request sequence number, and 32B data, and an ECC.
- 48uData may include a transaction type, a window, a request sequence number, and 48B data, and an ECC.
- 64uData may include a transaction type, a window, a request sequence number, and 64B data, and an ECC.
- 80uData may include a transaction type, a window, a request sequence number, and 80B data, and an ECC.
- 96uData may include a transaction type, a window, a request sequence number, and 96B data, and an ECC.
- 112uData may include a transaction type, a window, a request sequence number, and 112B data, and an ECC.
- 128uData include a transaction type, a window, a request sequence number, and 128B data, and an ECC.
- 256uData may include a transaction type, a window, a request sequence number, and 256B data, and an ECC.

As mentioned above, although the data transaction types may have increased in packet sizes by the amount of the request sequence number, even in systems with high performance NAND, the resulting sequence number may be just 16b. As such, the presently disclosed technique to reorder transaction operations for transaction operations that are reordered at a high frequency, or designed as such, may still be economical as compared with conventional protocols, which may add 16 bits to every response. Moreover, since the presently disclosed technique includes a sequence number for each response, the scalable protocol may not issue reorder messages or packets. Further, since each transaction operation is associated with a particular sequence number, the transaction operation may be transmitted in a round robin order to ensure that known data is not transmitted.

Ordering Effort Field

As discussed above, situations arise when transaction operations in one transaction window are preferred in order, but it may be beneficial to deviate from that order. Keeping this in mind, in addition to the two techniques for reordering transaction operations described above, in one embodiment, the scalable protocol may provide a flexible programming option for ordering transaction operations or packets in a system. The flexible programming option (e.g., ordering effort field) may set a degree of effort that the scalable protocol should use in maintaining the original order of transactions. That is, the flexible ordering effort field may indicate to the scalable protocol how hard it should work to ensure that the packets are transmitted in order. As such, the flexible ordering effort field may be associated with a range of values between a first value that corresponds to keeping every pack in order and a second value that corresponds to allowing anything to be reordered.

Keeping this in mind, transaction window 0 may be used as a general purpose control area for memory SoC 22. As such, transaction window 0 may reside in registers, SRAM buffers, cache SRAM, and other addressable control features. For each transaction window, the scalable protocol may enable configurable information that can be user programmed. As mentioned above, one type of the configurable information (e.g., ordering effort field) may include a degree of effort in maintaining original order (i.e., ordering effort). The ordering effort field may have a large variation in implementations. For instance, in a 2-bit field, the ordering effort may be characterized as follows:
- 00—allow re-ordering at every opportunity
- 01—allow considerable re-ordering
- 10—allow some re-ordering
- 11—allow no re-ordering, wait until resources are available In certain embodiments, the scalable protocol may associate certain packets with specific ordering zones. The ordering zone may indicate that the corresponding packets are to be treated similarly. For example, requests in the same ordering zone may be expected to be in order, and if not possible to be in order, then the transmitting component (e.g., memory SoC 22) may apply the ordering effort, as specified by the ordering effort field, to determine a degree in which the requests may be transmitted out of order.

The ordering zone may be related to a combination of a channel, a system window, and a transaction window (e.g., channel.syswin.window). Channel may be a channel number from which the request was received. System window may be an optional pair of fields that, for example, specifies which SoC in the system originated the request.

Keeping the foregoing in mind, a reasonable implementation of specifying the ordering effort in a 2-bit field assuming that a queue depth is 16 for an ordering zone may be as follows:
- 00—allow re-ordering at every opportunity: allow result slots to be swapped anywhere in the queue depth of 16
- 01—allow considerable re-ordering: allow result slots to be swapped anywhere in the queue depth of 11
- 10—allow some re-ordering: allow result slots to be swapped anywhere in the queue depth of 6
- 11—no re-ordering: allow no swapping, allow resources to idle In certain embodiments, an ordering effort function that defines the ordering effort may include additional variables such as an age of the request. For example:
- 00—allow re-ordering at every opportunity: allow result slots to be swapped anywhere in the queue depth of 16
- 01—allow considerable re-ordering: allow result slots to be swapped anywhere in the queue depth of 8 if the request is old and 14 if the request is young 10—allow some re-ordering: allow result slots to be swapped anywhere in the queue depth of 4 if the request is old and 8 if the request is young 11—no re-ordering: allow no swapping, allow resources to idle Here, the scalable protocol may enable the requests to be designated as being old or young. For instance, a request may be considered to be old if the request has existed for 7 or more request slots, while the request may be considered to be young if the request has existed for 6 or fewer request slots.

The above-listed examples illustrate a small subset of possible ways in which an ordering effort may be quantified in a 2-bit field. Additional degrees of ordering effort may be specified using a larger sized ordering effort field. In any case, the ordering effort field may provide the capability of simple programmability that makes ordering effort a function that may be useful in tuning overall system performance. In certain embodiments, the ordering effort employed by the host SoC 12 may be determined or specified when the host SoC 12 is powered on. That is, the host SoC 12 may determine the type of device it is connected to or the type of industry it is designed for and determine an ordering effort accordingly.

Backpressure Function for Bus Traffic Throttling

Backpressure may refer to an amount of bus traffic on a respective bus with respect to an available capacity of the buffer 23 (e.g., first-in-first-out (FIFO) buffer) receiving the bus traffic. As such, the backpressure of a respective bus may be considered to be high when the buffer 23 receiving the bus traffic is close to its depth limit. Once the buffer 23 becomes full, the receiving component in conventional systems may either ignore future incoming packets or accept the incoming packet and delete a packet presently in the buffer 23. In either of these cases, packets may not be processed and thus the integrity of the communication link may be compromised.

Figure 15:
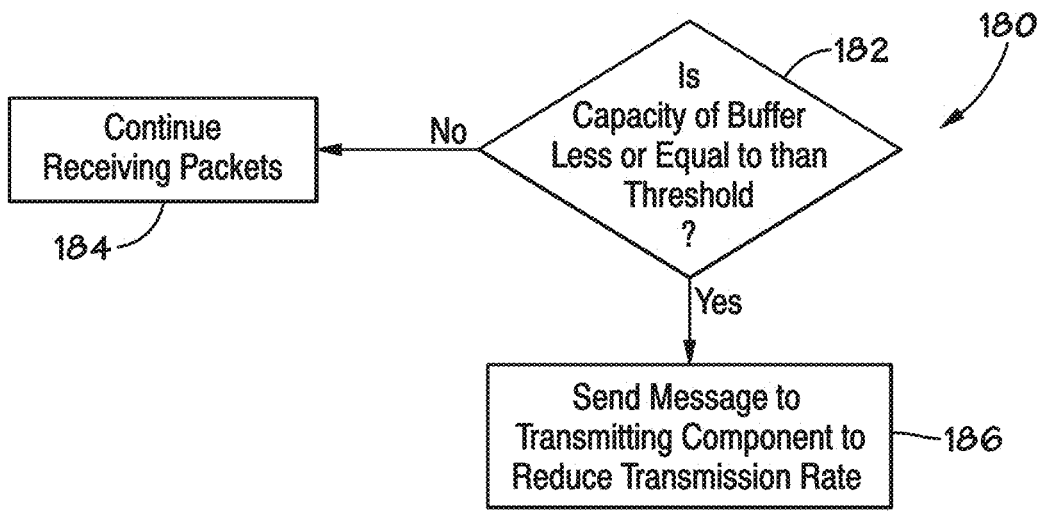
FIG. 15 illustrates a flow chart of a method for throttling back the transmission rate of requests sent from a transmitting component, in accordance with an embodiment.

Keeping this in mind, FIG. 15 illustrates a flow chart of a method 180 for throttling back the transmission rate of requests sent from a transmitter. Again the following method 180 is described as being performed by the host SoC 12 for illustrative purposes but may be performed by any suitable receiving component.

At block 182, the host SoC 12 (e.g., receiving component) may monitor the capacity of the buffer 23 and determine whether the capacity of the buffer 23 of the receiver is less than or equal to some threshold. If the capacity of the buffer 23 is above the threshold, the host SoC 12 may proceed to block 184 and continue receiving packets at the present transmission rate from the transmitting component.

If, however, the capacity of the buffer 23 is less than or equal to the threshold, the host SoC 12 may then proceed to block 186. At block 186, the host SoC 12 may send a message to the transmitting component to decrease the rate at which it is sending packets. At this time, both the host SoC 12 and the transmitting component may use the same backpressure function to throttle the transmittal and receipt of packets according to the same known mathematical function. As a result, the backpressure of the bus traffic may be reduced to accommodate for the processing of the data packets currently in the buffer 23, while reducing the likelihood of losing a packet.

In one embodiment, the bus traffic may be throttled back as the outstanding transaction count approaches a maximum window value (windowMax) and a maximum channel value (channelMax). The channelMax and windowMax fields may be independently set by a user or the scalable protocol. The channelMax field may correspond to a defined maximum transmission rate. For instance, the channelMax may be set to $1 \times 10^9$ requests per second. The windowMax field may correspond to a number of outstanding transaction operations. An example backpressure function may include linearly reducing a request rate after the windowMax or channelMax is at 90% capacity. At that point, the transmittal rate may be 100% at 0.900*Max and vary linearly to 0% at 0.995*Max. FIG. 16 graphically illustrates how the transmittal rate may be scaled back according to the above-described linear function.

In addition to linearly scaling back the transmission rate, the transmitting component may also scale back its transmissions according to a non-linear function. FIG. 17, for example, illustrates one possible non-linear curve that may be employed by the transmitting component when scaling back its transmission rate. It should be understood that the transmitting component is not limited to employing a non-linear transmission rate according to the curve depicted in FIG. 17. In another example, the non-linear curve may include a step down curve that incrementally scales back the transmission rate by finite steps.

In cases where just one transaction window is present on a channel, the windowMax field may not be relevant or may be considered to be equal to the channelMax field. In the case where there are multiple transaction windows, different backpressure functions may be defined for each respective transaction window. For instance, consider the following 4 examples of transaction windows that use a variety of different memory types as described below.

window0—control and registry window1—lowest latency DRAM window2—regular DRAM window 3—NAND Keeping this in mind, an example of how the backpressure function may be throttled based on the traffic of a channel may include defining a channel max (e.g., $1 \times 10^9$ requests per second), defining when the backpressure function may begin (e.g., RollbackStart 0.9 p.u.), and defining when the backpressure function may end (e.g., RollbackEnd 1 p.u.). In this example, the Rollback function may apply to the variable called Max, which may correspond to the channel max. Generally, the channel max corresponds to the rate at which requests (or transaction orders) are sent while the channel request rate is less than or equal to 0.9*channel max (e.g., up to RollbackStart).

In the same manner, each respective transaction window may employ a respective backpressure function. For instance, the backpressure functions of the four example transaction windows defined above may be implemented as follows:

Window0 window0max 0.05 p.u. of max
window0RollbackStart 0.045 p.u. of max
window0RollbackEnd 0.05 p.u. of max Window1 window1max 0.9 p.u. of max
window1RollbackStart 0.81 p.u. of max
window1RollbackEnd 0.9 p.u. of max Window2 window2max 0.3 p.u. of max
window2RollbackStart 0.27 p.u. of max
window2RollbackEnd 0.3 p.u. of max Window3 window3max 0.1 p.u. of max
window3RollbackStart 0.09 p.u. of max
window3RollbackEnd 0.1 p.u. of max As shown above, the backpressure function may gradually roll back request rates when there are many transaction windows (i.e., many simultaneous processes) interacting. In any case, by performing the throttling operations according to a function, as opposed to using transmitted signals, the scalable protocol may not be concerned with whether transmitted signals are in-band or out of band. Moreover, since the receiving component and the transmitting component may implement the same mathematical function without having to communicate when to implement the function, the scalable protocol may further reduce the amount of bits transferred across each respective bus.

In certain embodiments, the backpressure function may also account for the age of each request. For instance, if older requests are pooling in a transaction window, the receiving component may adjust the value of the windowMax or modify the Rollback limits for that particular transaction window.

In yet another embodiment, the backpressure function may also account queue depth. That is, at power up, the memory SoC 22 may have the ability to discover the capability of the module(s) connected to the memory SoC 22 based on information provided in the transaction window or the like. Part of the capabilities may include observing a queue depth of the receiver(s) connected to memory SoC 22 and perhaps can also discover the nominal packet-processing rate of a connected channel. Although the memory SoC 22 may not be able to track a receiver's queues, the memory SoC 22 may make some determinations regarding the status of the receiver's queues. For example, if the memory SoC 22 sends many packets in rapid succession exceeding a packet-processing rate of the receiving component, the memory SoC 22 may predict that a queue in the receiver component will grow. As such, if the memory SoC 22 determines that the packets are being sent faster than the packet-processing rate of the receiver, the memory SoC 22 may begin to apply the backpressure functions described above without receiving explicit feedback from the receiver. In other words, if the packet transmission rate exceeds the packet-packet processing rate, the memory SoC 22 may begin to reduce the packet transmission rate. In this way, the transmission rate may be reduced without adding messages to the channels. In some embodiments, the receiving component may send a message to the memory SoC 22 as a failsafe when the receiving component is not processing packets at its expected rate.

In another embodiment, the receiving component may include a system failsafe mechanism to indicate to the transmitting component that the buffer 23 is about to be overrun or exceed its capacity. Here, the receiving component may send a message similar to the not-acknowledged message described above. This message may have the same effect as the not-acknowledged message except that it may create an entry in a data log of the transmitting component to note that a message was rejected due to the buffer 23 being unable to accept the packet. As such, the transmitting component may determine a reason for the delay in bus traffic.

While the embodiments described herein may be susceptible to various modifications and alternative forms, specific embodiments have been shown by way of example in the drawings and have been described in detail herein. However, it should be understood that the disclosure is not intended to be limited to the particular forms disclosed. Rather, the disclosure is to cover all modifications, equivalents, and alternatives falling within the spirit and scope of the techniques and system described in the disclosure as defined by the following appended claims.

What is claimed is:

1. A method, comprising:
receiving, at a memory device, a stream of bits comprising a plurality of packets, wherein a portion of a first packet of the plurality of packets corresponds to a level of indirection field comprising a binary value representative of a number of pointers associated with performing a request that corresponds to the first packet;
determining the number of pointers based at least in part on the binary value in the level of indirection field; and
performing one or more operations on memory based at least in part on the number of pointers, wherein the one or more operations comprise one or more read operations, one or more write operations, or any combination thereof.

2. The method of claim 1, comprising retrieving contents of a memory location specified within the first packet based at least in part on the number of pointers.

3. The method of claim 1, wherein the number of pointers corresponds to a number of addresses accessed to access data associated with the request.

4. The method of claim 1, wherein the operations comprise:
reading an address of the memory based on the request, wherein the address comprises a linked list comprising a number of addresses that corresponds to the number of pointers;
parsing the linked list to identify a final address of the number of addresses; and
writing data in the memory based on the final address without accessing other addresses in the number of addresses.

5. The method of claim 1, wherein the binary value is representative of one of four that corresponds to the number of pointers.

6. The method of claim 1, wherein the operations comprise:
reading an address of the memory based on the request, wherein the address comprises a linked list comprising a number of addresses that corresponds to the number of pointers;
parsing the linked list to identify a final address of the number of addresses; and
reading data from the memory based on the final address without accessing other addresses in the number of addresses.

7. The method of claim 1, wherein the binary value of the level of indirection field is determined based on a software command associated with the first packet.

8. The method of claim 1, wherein the operations comprise parsing a linked list to identify a plurality of addresses based on the number of pointers.

9. The method of claim 1, wherein the stream of bits corresponds to data associated with an n-dimensional array, and wherein the number of pointers is equal to n.

* * * * *